United States Patent
Bush

(10) Patent No.: US 11,631,777 B2
(45) Date of Patent: Apr. 18, 2023

(54) INTEGRATION OF BYPASS DIODES WITHIN THIN FILM PHOTOVOLTAIC MODULE INTERCONNECTS

(71) Applicant: Swift Solar Inc., Redwood City, CA (US)

(72) Inventor: Kevin Alexander Bush, Golden, CO (US)

(73) Assignee: Swift Solar Inc., San Carlos, CA (US)

( * ) Notice: Subject to any disclaimer, the term of this patent is extended or adjusted under 35 U.S.C. 154(b) by 0 days.

(21) Appl. No.: 16/298,675

(22) Filed: Mar. 11, 2019

(65) Prior Publication Data

US 2020/0295209 A1 Sep. 17, 2020

(51) Int. Cl.

| | | |
|---|---|---|
| H01L 31/0443 | (2014.01) | |
| H01L 31/0463 | (2014.01) | |
| H01L 31/0725 | (2012.01) | |
| H01L 31/0224 | (2006.01) | |
| H01L 51/44 | (2006.01) | |
| H01L 31/05 | (2014.01) | |

(52) U.S. Cl.
CPC .. *H01L 31/0443* (2014.12); *H01L 31/022425* (2013.01); *H01L 31/0463* (2014.12); *H01L 31/0504* (2013.01); *H01L 31/0725* (2013.01); *H01L 51/442* (2013.01)

(58) Field of Classification Search
CPC ......... H01L 31/443; H01L 31/445–468; H01L 31/044–0468; H01L 51/42–448; H01L 31/0443; H01L 31/0463; H01L 31/022425; H01L 31/0504; H01L 31/0725; H01L 51/442
See application file for complete search history.

(56) References Cited

U.S. PATENT DOCUMENTS

| | | | |
|---|---|---|---|
| 4,956,023 A | * | 9/1990 | Tsuge ............... H01L 31/022425 136/258 |
| 6,690,041 B2 | | 2/2004 | Armstrong et al. |
| 10,644,179 B1 | | 5/2020 | Bush |
| 2002/0144724 A1 | | 10/2002 | Kilmer et al. |
| 2002/0164834 A1 | | 11/2002 | Boutros et al. |
| 2005/0121068 A1 | | 6/2005 | Sager et al. |
| 2010/0282291 A1 | * | 11/2010 | Goto ............... H01L 31/022466 136/244 |
| 2011/0023954 A1 | * | 2/2011 | Jung ...................... H01L 31/076 136/256 |
| 2011/0265857 A1 | | 11/2011 | Wang et al. |

(Continued)

FOREIGN PATENT DOCUMENTS

| | | | |
|---|---|---|---|
| CN | 102637700 A | * | 8/2012 |
| EP | 1443566 A1 | | 8/2004 |

(Continued)

OTHER PUBLICATIONS

Machine Translation of JP-2014179374-A (Year: 2020).*

(Continued)

*Primary Examiner* — Bethany L Martin

(74) *Attorney, Agent, or Firm* — Aikin & Gallant, LLP

(57) ABSTRACT

Thin-film solar cell modules and serial cell-to-cell interconnect structures and methods of fabrication are described. In an embodiment, a solar cell interconnect includes a bypass diode between adjacent solar cells to allow the flow of current around a single solar cell.

15 Claims, 14 Drawing Sheets

(56) References Cited

U.S. PATENT DOCUMENTS

| | | |
|---|---|---|
| 2011/0284986 A1 | 11/2011 | Rim et al. |
| 2012/0055544 A1 | 3/2012 | Ahn et al. |
| 2013/0008496 A1* | 1/2013 | Jee .................. H01L 31/0463 136/256 |
| 2014/0261657 A1* | 9/2014 | Cheng ............... H01L 31/046 136/256 |
| 2014/0261674 A1 | 9/2014 | Youngbull et al. |
| 2015/0007866 A1* | 1/2015 | Karst ............... H01L 31/0463 136/244 |
| 2015/0020864 A1 | 1/2015 | Dufoureq et al. |
| 2015/0228415 A1 | 8/2015 | Seok et al. |
| 2016/0196927 A1* | 7/2016 | Bryant ............... H01G 9/2059 136/244 |
| 2016/0233439 A1 | 8/2016 | Burschka et al. |
| 2017/0077344 A1 | 3/2017 | Youngbull et al. |
| 2017/0077402 A1* | 3/2017 | Oooka ............. H01L 51/0007 |
| 2017/0194102 A1 | 7/2017 | Huang et al. |
| 2018/0174761 A1 | 6/2018 | Kamino et al. |
| 2019/0074461 A1 | 3/2019 | Ding et al. |
| 2020/0152394 A1* | 5/2020 | Bush ................ H01L 27/301 |
| 2020/0152812 A1* | 5/2020 | Bush ................ H01G 9/2081 |

FOREIGN PATENT DOCUMENTS

| | | | | |
|---|---|---|---|---|
| EP | 2224495 A1 | | 9/2010 | |
| EP | 3654389 A1 | | 5/2020 | |
| JP | 2005268719 A | * | 9/2005 | |
| JP | 2014179374 A | * | 9/2014 | |
| KR | 20120028624 A | | 3/2012 | |
| KR | 10-2018-0051019 A | | 5/2018 | |
| WO | 2008030019 A1 | | 3/2008 | |
| WO | 2016186317 A1 | | 11/2016 | |
| WO | WO-2020101494 A1 | * | 5/2020 | ........ H01L 31/0463 |

OTHER PUBLICATIONS

CN-102637700-A Machine Translation.*
Trinidad, Evaluation of Hybrid Electrically Conductive Adhesives, University of Waterloo, 2016 (Year: 2016).*
Rowell, Michael W., et al. "Transparent electrode requirements for thin film solar cell modules" Energy & Environmental Science, The Royal Society of Chemistry, Oct. 20, 2010, 4 pgs.
Silverman, Timothy J., et al., "Thermal and Electrical Effects of Partial Shade in Monolithic Thin-Film Photovoltaic Modules" IEEE Journal of Photovoltaics, vol. 5, No. 6, Nov. 2015, 6 pages.
Silvestre, S., et al. "Study of Bypass Diodes Configuration on PV Modules" Applied Energy 86, (2009), Elsevier, pp. 1632-1640, 9 pgs. total.
Wilkinson, Ben et al. "Scaling limits to large area perovskite solar cell efficiency" EU PVSEC Paper, Wiley, Progress in Photovoltaics, Mar. 16, 2018, pp. 659-674, 16 pgs. total.
Li, Zhen et al., "Scalable Fabrication of Perovskite Solar Cells" Nature Reviews, Materials vol. 3, Article No. 18017, Mar. 27, 2018, 20 pages.
Crozier, M. L., et al. "Recent developments toward a one step thin-film PV interconnection process using laser scribing and inkjet printing," ResearchGate, Conference Paper, Jun. 2014, 6 pgs.
Fields, J.D. et al. "Printed interconnects for photovoltaic modules", Solar Energy Materials & Solar Cells 159 (2017), Elsevier, pp. 536-545, 10 pgs. total.
Dongaonkar, S. et al. "Performance and Reliability Implications of Two-Dimensional Shading in Monolithic Thin-Film Photovoltaic Modules," IEEE Journal of Photovoltaics, vol. 3, No. 4, Oct. 2013, pp. 1367-1375, 9 pgs. total.
Palma, A. L., et al., "Laser-Patterning Engineering for Perovskite Solar Modules With 95% Aperture Ratio," IEEE Journal of Photovoltaics 2017, 7 pgs.
Unknown Author, "Module Shading Guide" First Solar, Inc., 2017, PD-5-367 Rev. 1.0, 8 pages.

Jones-Albertus, R., et al. "Technology advances needed for photovoltaics to achieve widespread grid price parity" Progress in Photovoltaics: Research and Applications, Wiley Online Library, Apr. 20, 2016, pp. 1272-1283,12 pgs. total.
Kaltenbrunner, M. et al., "Flexible High Power-per-weight Perovskite Solar Cells with Chromium Oxide-Metal Contacts for Improved Stability in Air", Nature Materials, Articles, Aug. 24, 2015, vol. 14, pp. 1032-1039, 10 pgs. total.
Horowitz, K. A.W., et al. "An analysis of glass-glass CIGS manufacturing costs" Solar Energy Materials & Solar Cells 154 (2016), Elsevier, pp. 1-10.
Jacobs, D. A. et al., "A Re-evaluation of Transparent Conductor Requirements for Thin-Film Solar Cells", Journal of Materials Chemistry A, Paper, Royal Society of Chemistry, 2016, pp. 4490-4496, 7 pgs. total.
Steim, Roland et al. "Flexible polymer photovoltaic modules with incorporated organic bypass diodes to address module shading effects", Solar Energy Materials & Solar Cells 93 (2009), Elsevier, pp. 1963-1967, 5 pgs. total.
Saha, B. et al. "Schottky diode behaviour with excellent photoresponse in NiO/FTO heterostructure", Applied Surface Science 418 (2017), Elsevier, pp. 328-334, 7 pgs. total.
PCT/US2020/020481, "PCT International Search Report" dated Jun. 24, 2020, 3 pages.
Bermudez Veronica et al: "Understanding the cell-to-module efficiency gap in Cu(In,Ga) (S,Se)2 photovoltaics scale-up", Nature Energy, Nature Publishing Group UK, London, vol. 3, No. 6, Jun. 8, 2018 (Jun. 8, 2018), pp. 466-475.
19881327.1, "The Extended European Search Report" dated Feb. 1, 2022, 11 pages.
Bush, Kevin A. et al., "23.6%-efficient monolithic perovskite/silicon tandem solar cells with improved stability", nature energy, published Feb. 17, 2017, vol. 2, Article No. 17009, 7 pgs.
Chen, Han et al., "A solvent- and vacuum-free route to large-area perovskite films for efficient solar modules", Letter, doi:10.1038/nature23877, 2017, vol. 000, 15pgs.
Song, Zhaoning et al., "A technoeconomic analysis of perovskite solar module manufacturing with low-cost materials and techniques", Royal Society of Chemistry, Analysis, Energy & Environmental Science, published May 12, 2017, pp. 1297-1305 (13 pgs. total).
Boyd, Caleb C. et al., "Barrier Design to Prevent Metal-Induced Degradation and Improve Thermal Stability in Perovskite Solar Cells", ACS Energy Letters, 2018, pp. 1772-1778 (7 pgs. total).
Cheacharoen, Rongrong et al., "Design and understanding of encapsulated perovskite solar cells to withstand temperature cycling", Royal Society of Chemistry, Paper, Energy & Environmental Science, published Oct. 20, 2017, 7 pgs.
Grancini, G. et al., "One-Year stable perovskite solar cells by 2D/3D interface engineering", nature communications, Article, published Jun. 1, 2017, DOI:10.1038/ncomms15684, 8 pgs.
Yang, Mengjin et al., "Highly Efficient Perovskite Solar Modules by Scalable Fabrication and Interconnection Optimization", ACS Energy Letters, Letter, published 2018, pp. 322-328 (7 pgs. total).
Pisoni, Stefano et al., "Impact of interlayer application on band bending for improved electron extraction for efficient flexible perovskite mini-modules", Elsevier, Nano Energy, published 2018, pp. 300-307 (8 pags. total).
You, Jingbi et al., "Improved air stability of perovskite solar cells via solution-processed metal oxide transport layers", nature nanotechnology, Articles, vol. 11, published online: Oct. 12, 2015, DOI:10.1038/NNAN0.2015.230, pp. 75-82 (8 pgs. total).
Kato, Yuichi et al., "Silver Iodide Formation in Methyl Ammonium Lead Iodide Perovskite Solar Cells with Silver Top Electrodes", Advanced Materials Interfaces, Full Paper, published 2015, 6 pgs.
Domanski, Konrad et al., "Not All That Glitters is Gold: Metal-Migration-Induced Degradation in Perovskite Solar Cells", ACS Nano, Article, published 2016, DOI:10.1021/acsnano.6b02613, pp. 6306-6314 (9 pgs. total).
Christians, Jeffrey A. et al., "Stability at Scale: Challenges of Module Interconnects for Perovskite Photovoltaics", ACS Energy Letters, Energy Express, published 2018, DOI:10.11021/acsenergylett. 8b01498, pp. 2502-2503 (2 pgs. total).

(56) References Cited

OTHER PUBLICATIONS

Brinkmann, K.O. et al., "Suppressed decomposition of organometal halide perovskites by impermeable electron-extraction layers in inverted solar cells", nature communications, Article, Published Jan. 9, 2017, DOI:10.1038/ncomms13938, 9 pgs.

Bush, Kevin A. et al., "Thermal and Environmental Stability of Semi-Transparent Perovskite Solar Cells for Tandems Enabled by a Solution-Processed Nanoparticle Buffer Layer and Sputtered ITO Electrode", Advanced Materials, Materials Views, Communication, published 2016, DOI:10.1002/adma.201505279, pp. 3937-3943 (7 pgs. total).

Powalla, Dr. -Ing.Michael, "Development of Materials and Processes for the Production of Solar Modules, The Sequence of Processing Steps for the Production of a Cu(In,Ga)Se2 Thin-Film Solar Module", Zentrum fur Sonnenenergie- und Wasserstoff-Forschung (ZSW), Jun. 2008, Germany, 1 pg.

Eperon, Giles E. et al., "Perovskite—perovskite tandem photovoltaics with optimized bandgaps", ResearchGap, Article in Science, Oct. 2016, DOI:10.1126/science.aaf9717, 10 pgs.

Heise, Gerhard et al., "Monolithical Serial Interconnects of Large CIS Solar Cells with Picosecond Laser Pulses", Elsevier, Physics Procedia, ScienceDirect, LiM 2011, pp. 149-155 (7 pgs. total).

Gehlhaar, Robert et al., (2015). "Perovskite solar modules with minimal area loss interconnections", SPIE Newsroom. 10.1117/2.1201509.006116., 3 pgs.

PCT/US2019/059078 "International Search Report and Written Opinion" dated Apr. 10, 2020, 12 pages.

Fields et al., "Printed interconnects for photovoltaic modules", Solar Energy Materials & Solar Cells 159 (2017) 536-545. (Year: 2017).

Sanehira et al., "Influence of Electrode Interfaces on the Stability of Perovskite Solar Cells: Reduced Degradation Using MoOx/Al for Hole Collection", ACS Energy Lett. 2016, 1, 38-45 (Year: 2016).

Jin et. al., "High temperature coefficient of resistance molybdenum oxide and nickel oxide thin films for microbolometer applications", Optical Engineering 54(3), 037101-1-037101-6 (Mar. 2015).

Leijtens, Thomas et al., "Opportunities and challenges for tandem solar cells using metal halide perovskite semiconductors," Nature Energy 3, 828-838 (2018) https://doi.org/10.1038/S41560-018-0190-4, 11 pages.

PCT/US2020020481, "Extended European Search Report", dated Nov. 25, 2022, 5 pages.

* cited by examiner

INTEGRATION OF BYPASS DIODES WITHIN THIN FILM PHOTOVOLTAIC MODULE INTERCONNECTS

BACKGROUND

Field

Embodiments described herein relate to solar cells, and more particularly to interconnect structures for perovskite solar cell modules.

Background Information

Photovoltaic cells, also referred to solar cells, are devices that convert radiant photo energy into electrical energy. Multiple solar cells may be integrated into a group to constitute a solar panel, or module, in which the solar cells are usually connected in series creating an additive voltage.

Reverse bypass diodes may be included in some implementations to provide operational stability to a photovoltaic module. For example, shading of a solar cell wired in series within a string of solar cells can force the cell into reverse bias, causing hot-spot heating which may lead to detrimental effects such as cracking, shorting, or delamination. A bypass diode can limit the reverse bias voltage a shaded solar cell experiences, thus preventing the creation of such hot-spots.

Bypass diodes may generally be soldered into a photovoltaic array during module layup and packaging. For a silicon solar cell array, only a few bypass diodes are required to ensure operational stability and prevent damage from hot-spots because of the high reverse bias breakdown voltage of silicon solar cells. Specifically, the bypass diodes are added at the edge of the photovoltaic module and connected in parallel to a string, or strings, of solar cells, with an opposite polarity to the solar cells. If one or more of the solar cells in a serially connected string is shaded, they could be put in reverse bias. In this case, the bypass diode that is wired in parallel to the string is put into forward bias to allow the flow of current over some threshold voltage, essentially allowing current to flow around the string including the shaded solar cell(s).

SUMMARY

Thin-film solar cell modules and serial cell-to-cell interconnect structures and methods of fabrication are described. In an embodiment, a solar cell module circuit includes a plurality of solar cell diodes that are connected in series between a pair of voltage terminals, and a plurality of bypass diodes, each bypass diode in parallel with a corresponding solar cell diode. This may be accomplished by integrating the bypass diodes into the cell-to-cell interconnect structures.

In an embodiment, a solar cell module includes a string of solar cells connected in series, in which each solar cell includes a bottom electrode layer, a subcell layer over the bottom electrode layer, and a top electrode layer over the subcell layer. An interconnect is formed between two adjacent solar cells in the string of solar cells, with the interconnect including an electrical connection between a respective bottom electrode layer and a respective top electrode layer of the adjacent solar cells, and a bypass diode between the bottom electrode layers of the adjacent solar cells.

In an embodiment, a solar cell interconnect includes a bottom electrode layer, a first patterned line opening in the bottom electrode layer, a subcell layer over the bottom electrode layer, a second patterned line opening in the subcell layer, a semiconductor-based bypass layer along a sidewall of the subcell layer in the second patterned line opening, a conductive plug adjacent the semiconductor-based bypass layer and within the second patterned line opening, a top electrode layer over the subcell layer, and a third patterned line opening in the top electrode layer.

DETAILED DESCRIPTION

Figure 1:
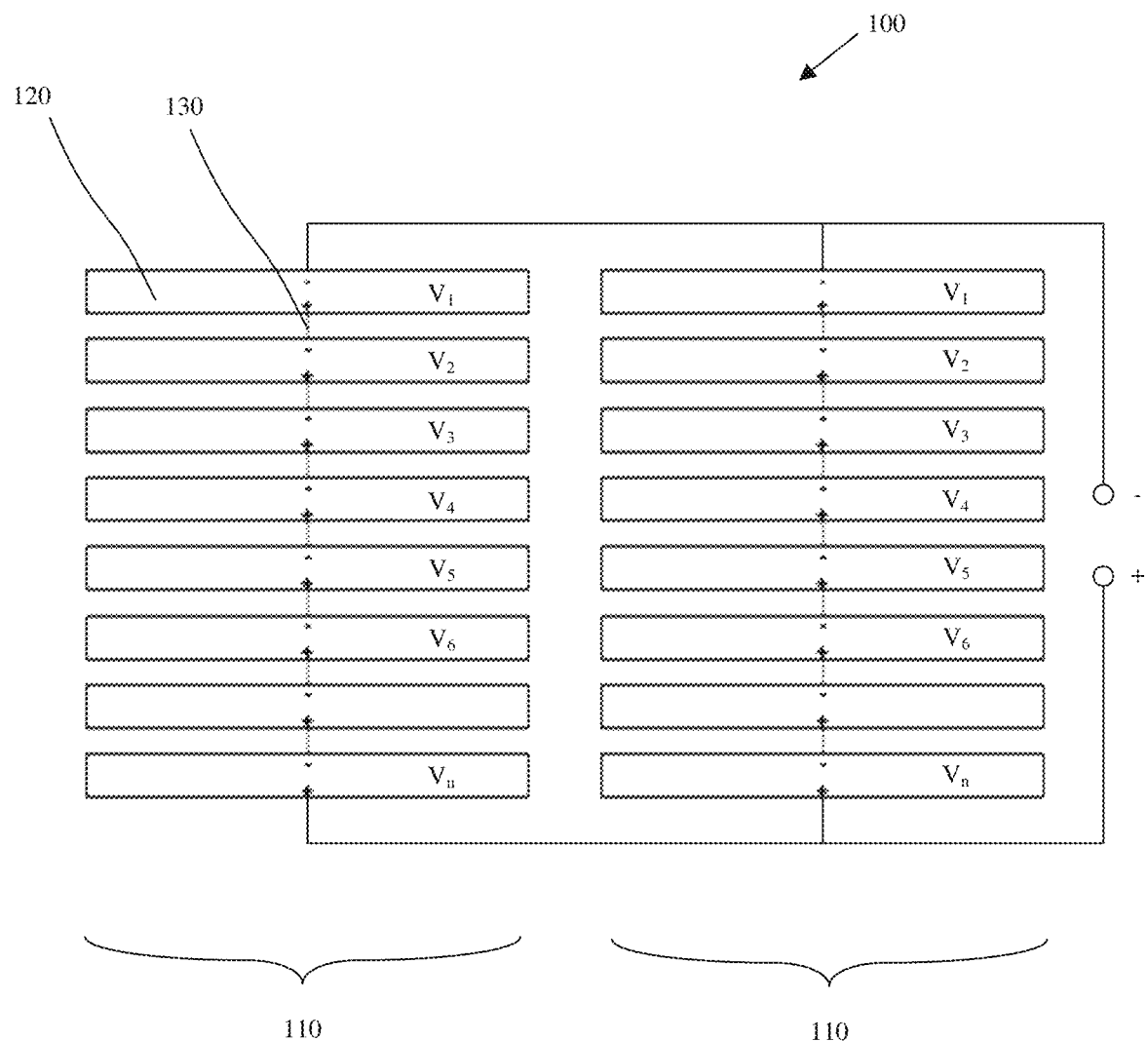
FIG. 1 is a schematic top view illustration and circuit diagram of a solar cell module in accordance with embodiments.

Embodiments describe solar cell modules and solar cell interconnects, and in particular solar cell interconnects that include a bypass diode that allows the flow of current around a single solar cell.

In one aspect, embodiments are directed to the integration of bypass diodes into thin-film solar cells. It has been observed that thin film solar cells (e.g. based on cadmium-telluride (CdTe), copper-indium-gallium-diselenide (CIGS), perovskite, organic, etc.) typically have much lower reverse bias breakdown voltages that silicon solar cells. For illustrative purposes, an exemplary thin film module may be fabricated with 1 cm wide cells that are wired together via monolithically-integrated serial connections. Such an exemplary module may have over 100 cells spanning the width of the module. Due to the low reverse bias breakdown voltages of the thin film solar cells, a significant number of bypass diodes may be included to ensure operational stability. In accordance with embodiments, bypass diodes are integrated within the monolithic interconnects of the thin film photovoltaic modules. Furthermore, such integration structures may increase geometric fill factor, lower cost, and improve flexibility.

In another aspect, the bypass diodes may be Schottky diodes formed with an electrically conductive material (e.g. carbon or metal) and semiconductor material. In such a configuration, current can generally flow form the conductive side to the semiconductor side, but not in the opposite direction. Accordingly, such a Schottky barrier may facilitate fast switching and a low forward voltage drop, which are both useful for inclusion within the interconnect structure between individual solar cells.

In an embodiment, a solar cell module includes a string of solar cells connected in series. Each solar cell can include a bottom electrode layer, a subcell layer over the bottom electrode layer, and a top electrode layer over the subcell layer. The subcell layer may include an absorber layer, one or more transport layers, such as electron and/or hole transport layer(s). An interconnect is located between two adjacent solar cells in the string of solar cells. The serial electrical connection can be made within the interconnect between a respective bottom electrode layer and a respective top electrode layer of the adjacent solar cells. In accordance with embodiments, the interconnect additionally includes a bypass diode between the bottom electrode layers of the adjacent solar cells.

In an embodiment, a solar cell interconnect includes a bottom electrode layer including a first bottom electrode layer and a second bottom electrode layer separated by a first patterned line opening in the bottom electrode layer. A subcell layer is over the bottom electrode layer, the subcell layer including a first subcell layer and a second subcell layer separated by a second patterned line opening in the subcell layer. A patterned top electrode layer is over the subcell layer, the patterned top electrode layer including a first top electrode layer over the first subcell layer and a second top electrode layer over the second subcell layer. In accordance with embodiments, a solar cell diode path extends between the second bottom electrode layer, the first top electrode layer, the first subcell layer, and the first bottom electrode layer, while a bypass diode path extends between the second bottom electrode layer and the first bottom electrode layer.

In an embodiment a solar cell interconnect structure includes a bottom electrode layer, a first patterned line opening in the bottom electrode layer, a subcell layer over the bottom electrode layer, a second patterned line opening in the subcell layer, a semiconductor-based bypass layer along a sidewall of subcell layer in the second patterned line opening, and a conductive plug adjacent the semiconductor-based bypass layer and within the second patterned line opening. A top electrode layer is formed over the subcell layer, and a third patterned line opening is formed in the top electrode layer.

In some particular embodiments the solar cell interconnect structures may be compatible with metal-halide perovskite-based solar cells, and additionally allow for the use of a metal rear electrode, which can provide rear reflection for light harvesting, low cost, and high conductivity. It has been observed that the performance and stability of metal-halide perovskite-based solar cells are highly susceptible to metal induced degradation caused by halide-metal interactions. Specifically, metal electrodes may react with halides in the perovskite and act as a sink for halides and corrosion of the metal electrode, degrading conductivity. In accordance with various embodiments, solar cell module interconnect structures are described to prevent perovskite-metal contact and the damage of the subcell structure. Furthermore, the interconnect structures in accordance with embodiments may act to prevent the ingress of moisture and oxygen and egress of volatile organic components, which may significantly increase the stability of metal-halide perovskite-based solar cells.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", and "on" as used herein may refer to a relative position of one layer with respect to other layers. One layer "over", or "on" another layer or in "contact" with another layer may be directly in contact with the other layer or may have one or more intervening layers. One layer "between" layers may be directly in contact with the layers or may have one or more intervening layers.

Referring now to FIG. 1 a schematic top view illustration is provided of a solar cell module in accordance with embodiments. As shown, the solar cell module 100 includes a plurality of cells 120 (also referred to as solar cells) coupled in series with interconnects 130, with the front of one cell connected to the rear of the next cell so that their voltages ($V_1 \ldots V_n$) add. The plurality of cells 120 may be arranged into one or more subsets 110 (e.g. strings) coupled in parallel, which may have the effect of decreasing total module voltage.

A thin-film solar cell 120 commonly includes a subcell between two electrodes, at least one of which being transparent. As described in more detail with regard to FIGS. 4A-4B and FIGS. 5A-5B, the subcell may commonly include an absorber layer and one or more transport layers (e.g. hole transport, electron transport). The subcells in accordance with embodiments can include a single junction, or a multiple junction structure with multiple absorber layers. In order to minimize loss due limited conductivity of the transparent electrode, the module is divided into the plurality of smaller cells 120 which are electrically connected in series. The serial interconnect methodologies in accordance with embodiments may generally include a plurality of patterned line openings (P1, P2, P3, etc.) to form interconnects 130, such as a first patterned line opening P1 through a bottom electrode, a second patterned line opening P2 through the subcell which includes the absorber and transport layer(s), and a third patterned line opening P3 through a top/rear electrode to electrically isolate adjacent cells 120.

Figure 2A:
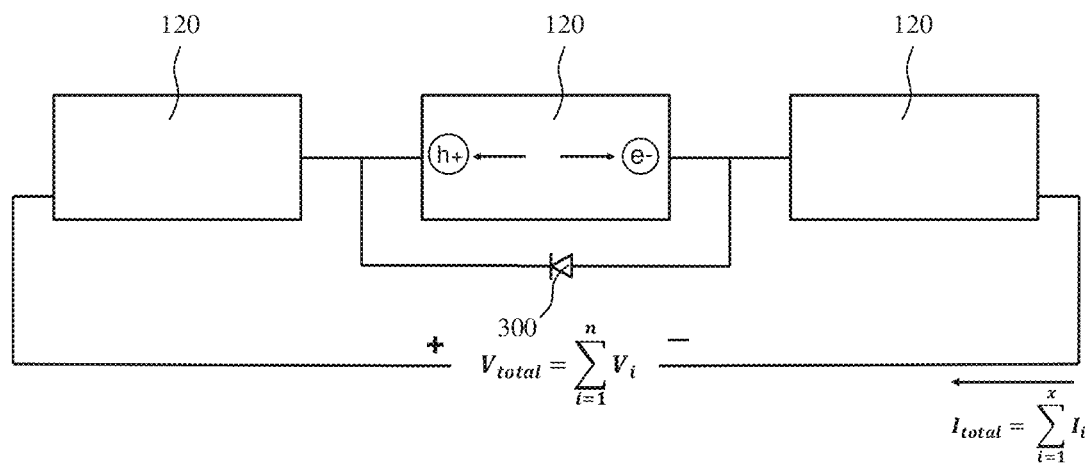
FIG. 2A is a circuit diagram illustrating a bypass diode in parallel with a solar cell in a string of solar cells in accordance with an embodiment.
Figure 2B:
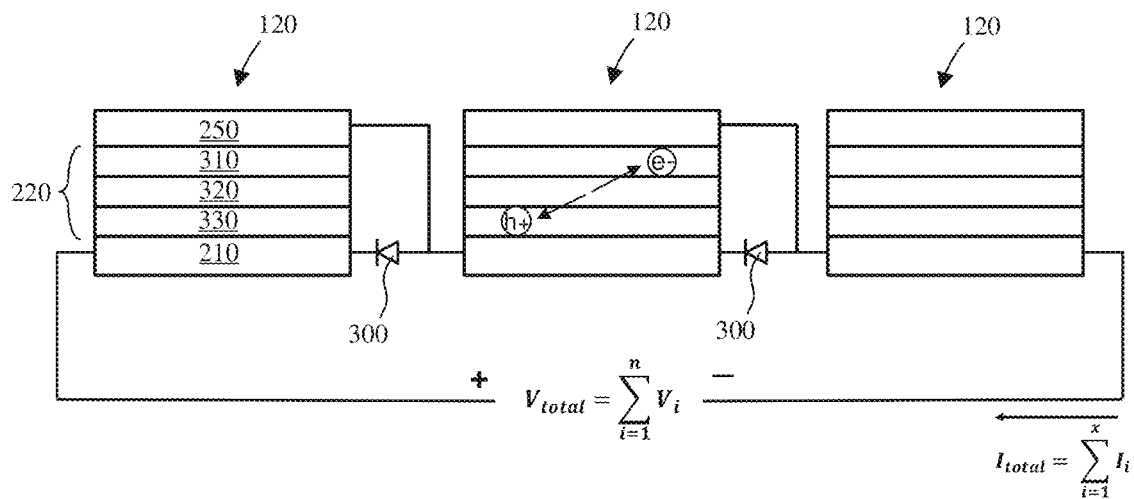
FIG. 2B is a combination solar cell stack-up and circuit diagram illustrating connections of bypass diodes between adjacent solar cells in a string of solar cells in accordance with an embodiment.

Referring now to FIGS. 2A-2B, FIG. 2A is a circuit diagram illustrating a bypass diode in parallel with a solar cell in a string of solar cells in accordance with an embodiment; FIG. 2B is a combination solar cell stack-up and circuit diagram illustrating connections of bypass diodes between adjacent solar cells in a string of solar cells in accordance with an embodiment.

As illustrated, the solar cell module circuit can include a plurality of solar cell 120 diodes connected in series between a pair of voltage terminals (+/−), and a plurality of bypass diodes 300. As shown in FIG. 2A, each bypass diode 300 is in parallel with a corresponding solar cell 120 diode. Referring to the detailed stack-up in FIG. 2B each solar cell 120 includes a bottom electrode layer 210 and top electrode layer 250, and subcell layer 220 between. As shown, each bypass diode 300 includes a first terminal connected to a bottom electrode layer 210 of a first adjacent solar cell 120 diode, and a second terminal connected to a bottom electrode layer 210 of a second adjacent solar cell 120 diode.

The particular embodiments illustrated in FIGS. 2A-2B illustrate solar cells 120 including a subcell layer 220 with bottom hole transport layer 330, absorber layer 320, and top electron transport layer 310. It is to be appreciated that this simplified stack-up is exemplary, and embodiments are not so limited. Embodiments may alternatively organize the transport layers in reverse, with a bottom electron transport layer 310 and top hole transport layer 330. Furthermore, the subcell layers 220 may include additional layers, and may include multiple cell stack-ups, such as tandem solar cell stack-ups.

Figure 3A:
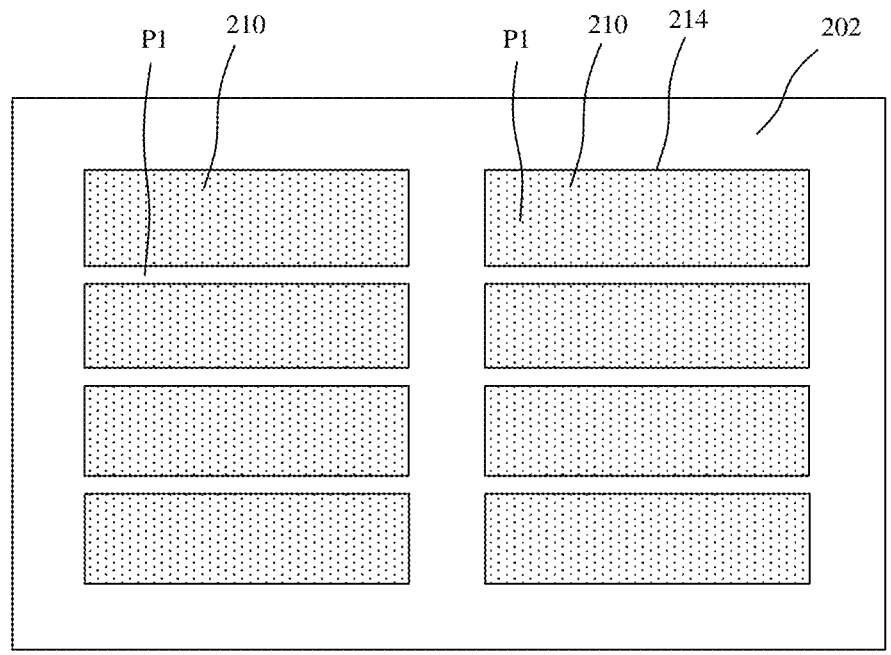
FIGS. 3A-3E are schematic top view illustrations of a method of fabricating a solar cell module in accordance with embodiments.
Figure 3B:
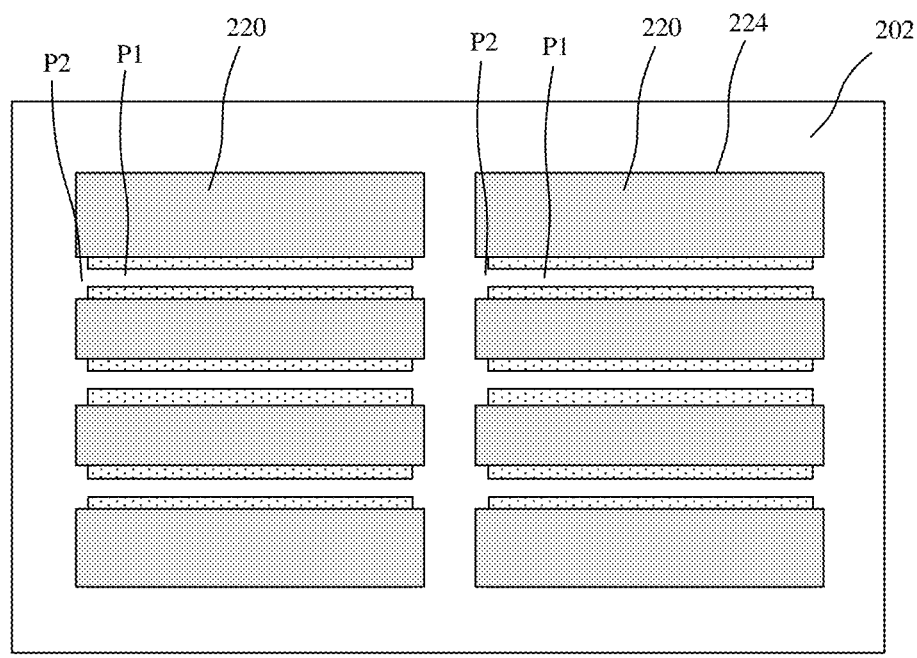

Referring now to FIGS. 3A-3E, schematic top view illustrations are provided of a method of fabricating a solar cell module 100 in accordance with embodiments. As shown in FIG. 3A, the sequence may begin with the formation of one or more bottom electrode layers 210 on a substrate 202. In the particular embodiment illustrated the bottom electrode layer is patterned to form two subsets 110 that may be coupled in parallel as described with regard to FIG. 1. Each bottom electrode layer 210 includes an outside perimeter 214 and may be patterned to form first patterned line openings P1 and multiple adjacent bottom electrode layers 210. A subcell layer 220 may then be formed over the patterned bottom electrode layer 210, followed by patterning of second patterned line openings P2 as illustrated in FIG. 2B. As shown, the subcell layer 220 may optionally be longer than the bottom electrode layer 210 along the P1 scribe direction. In some embodiments, the outside perimeter 224 of the subcell layer 220 may be aligned with the outside perimeter 214 of the bottom electrode layer 210, or laterally surround the outside perimeter 214 of the bottom electrode layer. Alternatively, the subcell layer 220 may have the same width of the bottom electrode layer 210, which may provide encapsulation function for the subcell layer 220.

Figure 3C:
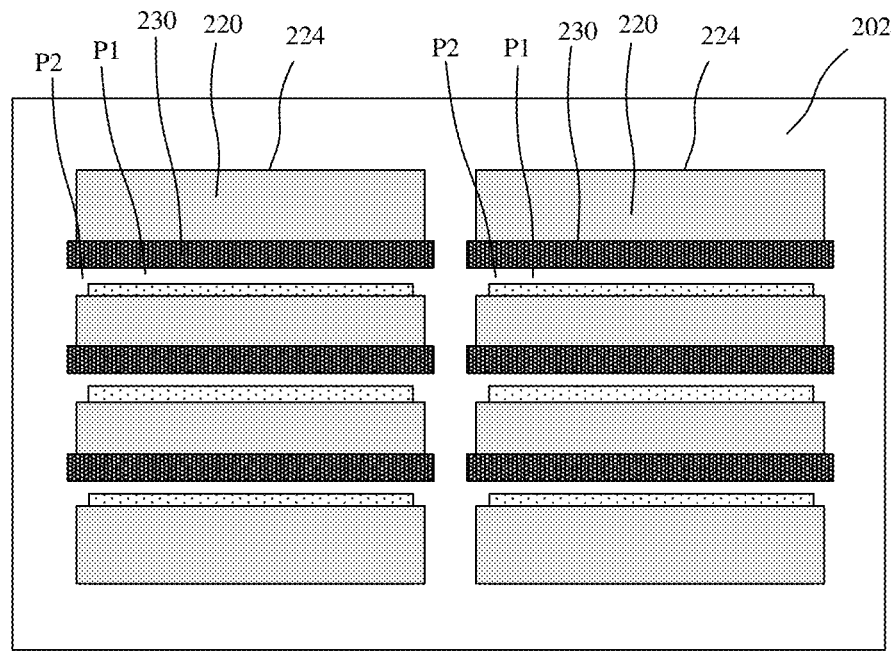

Referring now to FIG. 3C a semiconductor-based bypass layer 230 is formed along a single sidewall of the subcell layers 220, which may have been formed from the second patterned line openings P2. The semiconductor-based bypass layer 230 may form a portion of the bypass diode. Suitable materials include extrinsically doped, or intrinsically charged, metal oxides such as zinc oxide, aluminum doped zinc oxide (AZO), tin oxide, indium oxide, titanium oxide, and niobium doped titanium oxide. The semiconductor-based bypass layer may additionally be non-reactive with the absorber layer material. In an embodiment, the semiconductor-based bypass layer 230 is formed of a material with an opposite charge transport type compared to the bottom transport layer of the adjacent subcell layer 220. In the embodiment illustrated, where the bottom transport layer is a hole transport layer (e.g. p-type), the semiconductor-based bypass layer 230 is n-type, and vice versa. The semiconductor-based bypass layer 230 may be formed using a suitable technique such as ink jet, extrusion, spraying, etc. As illustrated, the semiconductor-based bypass layer 230 may be longer than the subcell layers 220 along the P2 scribe direction. This may help prevent shorting and provide chemical protection against subsequently formed layers.

Figure 3D:
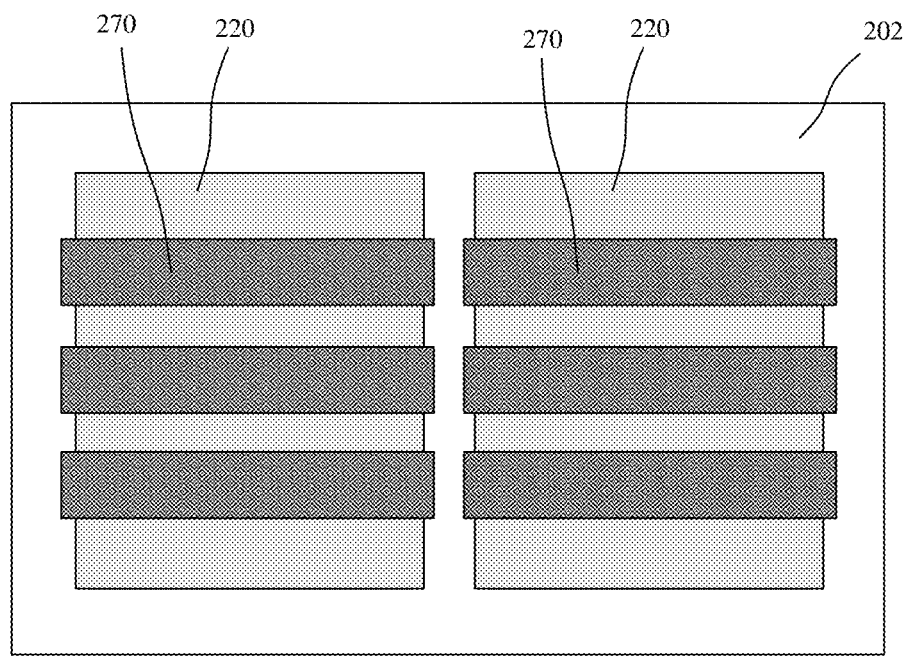

A conductive plug 270 is then formed adjacent the semiconductor-based bypass layer 230 and within the second patterned line opening P2. As illustrated in FIG. 3D, the conductive plug 270 may also be formed over and cover the semiconductor-based bypass layer 230. In an embodiment, the conductive plug 270 is formed of a material with an opposite charge transport type than the semiconductor-based bypass layer 270 so as to create a diode. In an embodiment, the conductive plug 270 includes a metallic material or carbon, which may form a Schottky diode with the semiconductor-based bypass layer 230, or any optional intervening material that may be applied between the layers to improve selectivity. In an embodiment, where the semiconductor-based bypass layer 230 is n-type, the conductive plug may be characterized by a deep work function. Conversely, were the semiconductor-based bypass layer 230 is p-type, the conductive plug may be characterized by a shallow work function. In some embodiments, the conductive plug 270 is formed of a material that does not react with the absorber layer material. This may be useful if the conductive plug 270 is in contact with, or close proximity to a sensitive absorber layer material. For example, carbon and carbon/polymer blends are not reactive with perovskite-based materials. Carbon may also be characterized by a deep work function. Alternative structures, including trenches and intervening layers, may also be utilized to separate reactive or sensitive layers. Other suitable conductive plug 270 materials may include other metallic materials such as molybdenum, nickel, silver, gold, copper, and aluminum depending upon the solar cell materials, and interconnect structure. In an embodiment, the conductive plug may be formed of other conductive materials, such as metal oxide, or particles thereof, particularly where the conductive plug does not form a Schottky junction. The conductive plug 270 may be formed using a suitable technique such as ink jet, extrusion, spraying, screen printing, etc.

Figure 3E:
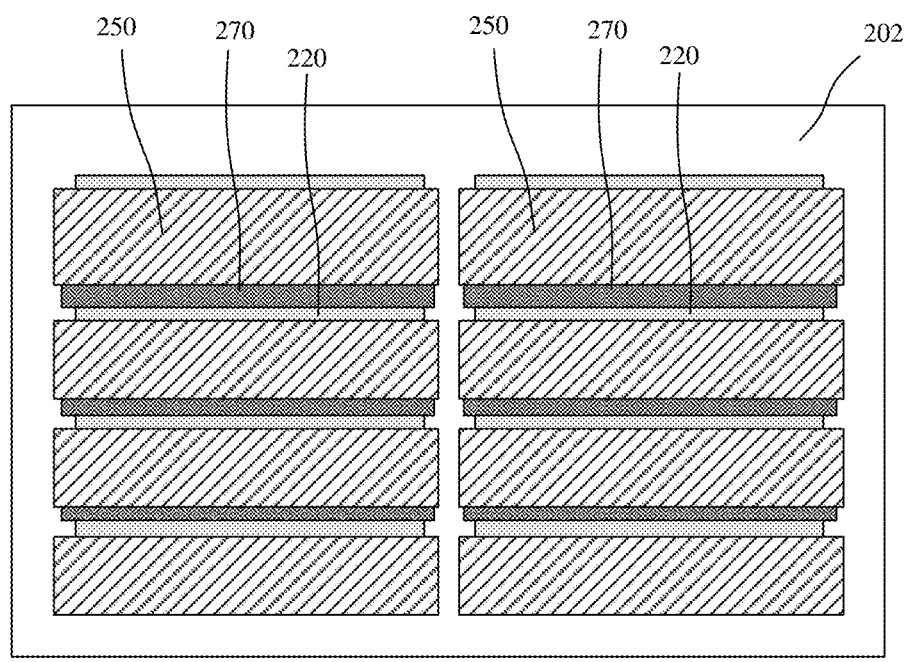

Referring now to FIG. 3E a patterned top electrode layer 250 is formed over the underlying structure, with the third patterned line openings P3 through the top electrode layer 250 separating top electrodes of adjacent cells 120. It is understood additional layer(s) may be formed prior to the top electrode layer 250, such as a conformal barrier layer, which will be described in more detail in the following description.

In accordance with some embodiments, the semiconductor-based bypass layer 230 and conductive plug 270 may serve dual purposes, for creating a bypass diode 300 between bottom electrode layers 210, and providing serial connection between a bottom electrode layer 210 and adjacent top electrode layer 250. Furthermore, materials selection may consider chemical compatibility of adjacent layers and specific charge transport type.

In an embodiment, the patterned top electrode layer 250 includes a metal layer, and the bottom electrode layer 210 includes a transparent material. Exemplary transparent bottom electrode materials include poly(3,4-ethylenedioxythiophene) polystyrene sulfonate (PEDOT:PSS), transparent conductive oxides (TCOs) such as indium tin oxide (ITO), fluorine doped tin oxide (FTO), indium zinc oxide (IZO), aluminum doped zinc oxide (AZO), cadmium stannate, etc.

Figure 4A:
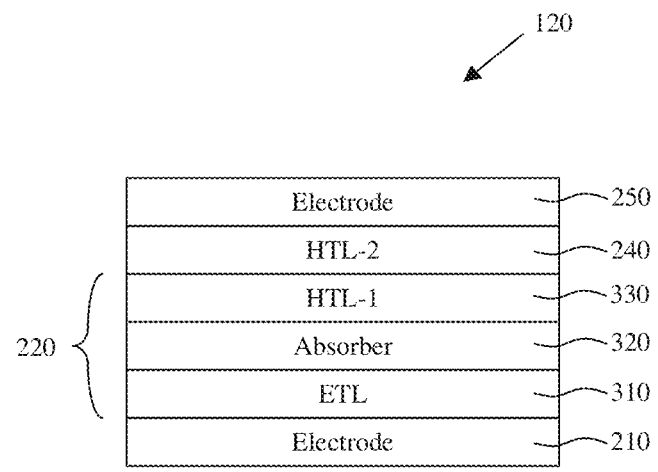
FIG. 4A is an illustrative diagram of solar cell stack-up in accordance with embodiments.
Figure 4B:
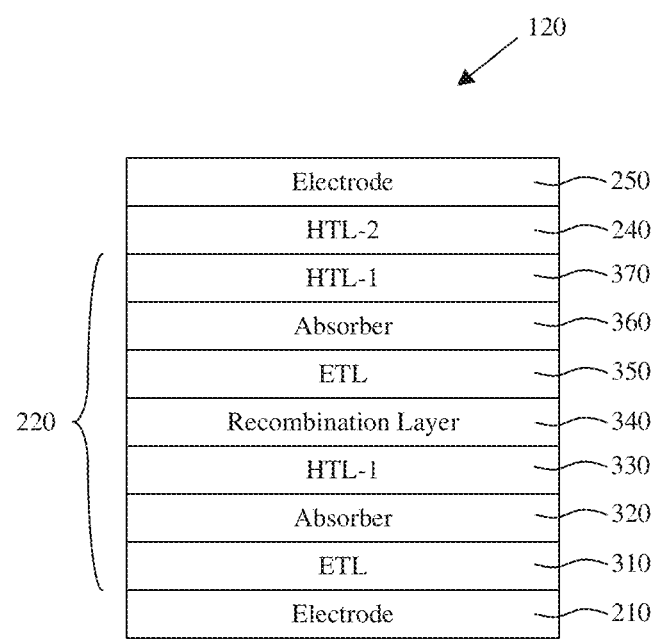
FIG. 4B is an illustrative diagram of tandem solar cell stack-up in accordance with embodiments.

Various exemplary solar cell 120 stack-ups are illustrated in FIGS. 4A-4B. FIG. 4A is an illustrative diagram of single junction solar cell stack-up in accordance with an embodiment. As illustrated, the solar cell 120 may include a bottom electrode layer 210, a top electrode layer 250, and a subcell layer 220 between the bottom and top electrode layers. Additionally, a conformal barrier layer 240 may be formed on the subcell layer 220. The conformal barrier layer 240 may additionally function as a charge transport layer. In the particular embodiment illustrated, the conformal barrier layer 240 functions as both a barrier layer and hole transport layer. The subcell layer 200 includes an absorber layer 320 and one or more transport layers. In the embodiment illustrated, the subcell layer 200 includes an electron transport layer (ETL) 310 over the bottom electrode, an absorber layer 320 over the ETL 310, and an optional first hole transport layer (HTL) 330 over the absorber layer 320. The conformal barrier layer 240 may also function as an HTL in this configuration, and physically separate the top electrode layer 250 from the subcell layer 220, and specifically from the absorber layer 320. In a specific embodiment, bottom electrode layer 210 is formed of a transparent material such as ITO or IZO, ETL 310 is formed of a n-type metal oxide such as titanium oxide, and the absorber layer 320 is a perovskite-based material. In an embodiment, optional HTL 330 is formed of poly(triaryl amine) (PTAA) or 2,2',7,7'-Tetrakis [N,N-di(4-methoxyphenyl)amino]-9,9'-spirobifluorene (spiro-MeOTAD), while the conformal barrier layer 240 is formed of a metal oxide such as vanadium oxide or tungsten oxide. In an embodiment, the top electrode layer 250 includes one or more metal layers, such as Ag, Au, Cu, Al, etc.

FIG. 4B is an illustrative diagram of tandem solar cell stack-up in accordance with embodiments. The tandem structure may include multiple absorber layers, which may be the same or different materials. In the specific embodiment described the tandem structure is a perovskite-perovskite tandem structure, though embodiments are not so limited. Electrode layer 210, ETL 310, and absorber layer 320, and HTL 330 may be similar as described with regard to FIG. 4A. Similarly, ETL 350 may be similar to ETL 310, absorber layer 360 similar to absorber layers 320, and HTL 370 similar to HTL 330. Notably, while absorber layers 320, 360 may be formed of similar perovskite-based materials, they may be tuned for different bandgaps. A recombination layer 350 may be located between the stacked subcells, between ETL 350 and HTL 330. Recombination layer 350 may be a transparent conducting layer such as a TCO, or ITO specifically. Conformal barrier layer 240 and top electrode layer 250 may additionally be formed similarly as with regard to FIG. 4A.

Figure 5A:
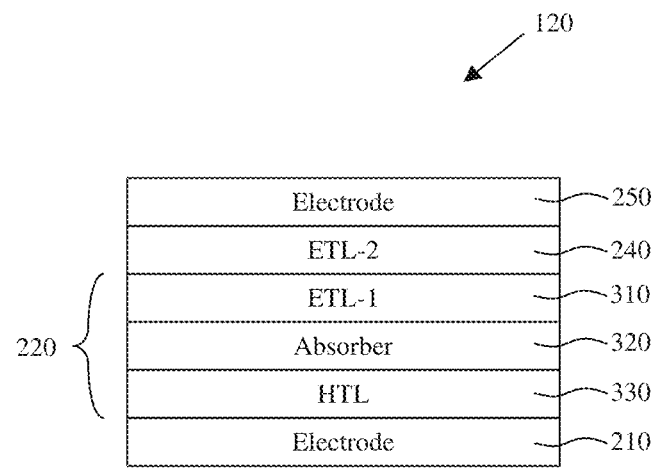
FIG. 5A is an illustrative diagram of solar cell stack-up in accordance with embodiments.
Figure 5B:
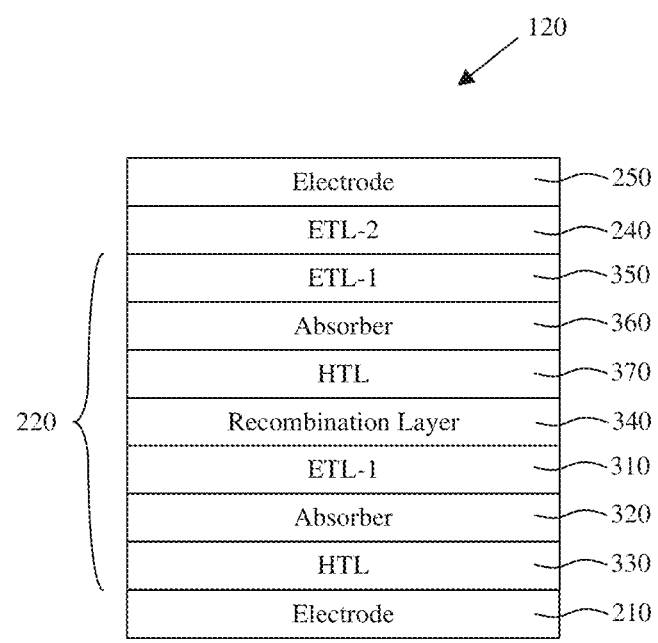
FIG. 5B is an illustrative diagram of tandem solar cell stack-up in accordance with embodiments.

Referring now to FIGS. 5A-5B, FIG. 5A is an illustrative diagram of solar cell stack-up in accordance with an embodiment, and FIG. 5B is an illustrative diagram of tandem solar cell stack-up in accordance with an embodiment. FIGS. 5A-5B are similar to the structures of FIGS. 4A-4B, with the order of electron and hole transport layers being flipped. This change in order of layer formation may additionally change materials selection of layers. In an embodiment, HTL 320 is formed of a metal oxide such as nickel oxide. ETL 310 may be a single layer or multiple layers. In an embodiment of FIG. 5A, ETL 310 is formed of a fullerene, with the conformal barrier layer 240 including a transparent metal oxide such as tin oxide, AZO, or titanium dioxide. In an embodiment of FIG. 5B, ETL 310 may include multiple layers, for example a transparent metal oxide such as tin oxide or AZO formed over a fullerene layer. Other layers illustrated may be similar as described with regard to FIGS. 4A-4B.

Figure 6A:
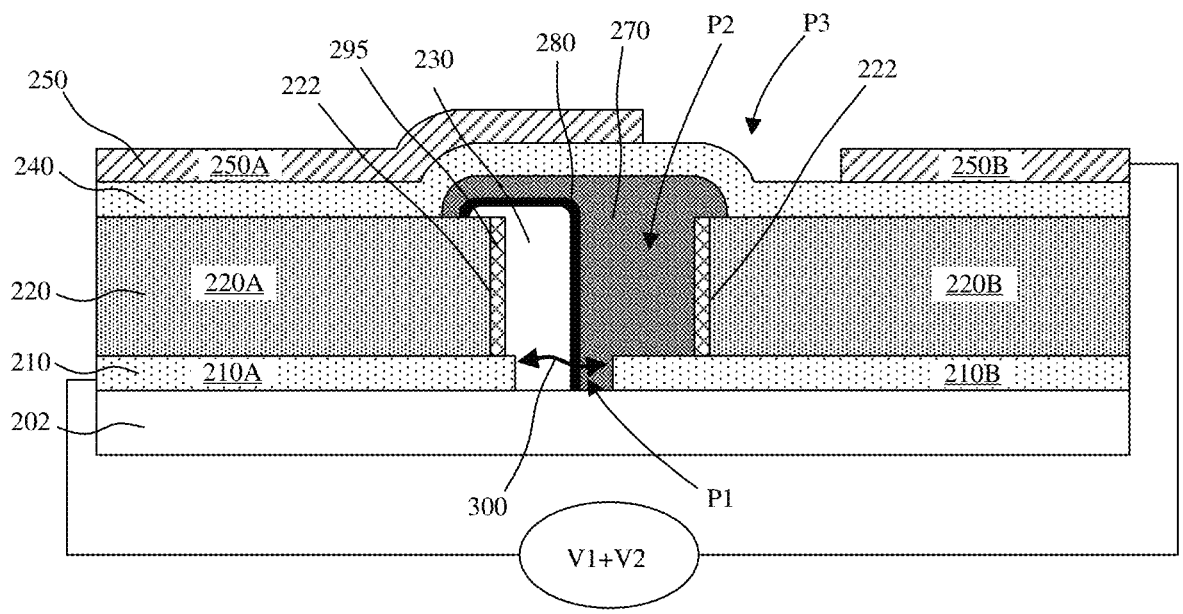
FIG. 6A is a schematic cross-sectional side view illustration of a solar cell interconnect in accordance with an embodiment.

Referring now to FIG. 6A a schematic cross-sectional side view illustration is provided of a solar cell interconnect in accordance with an embodiment. Specifically, FIG. 6A illustrates the interconnect between serial cells 120, and additive voltages V1, V2 as shown in FIG. 1. The solar cell interconnect may include a bottom electrode layer 210 on a substrate 202. The bottom electrode layer includes a first bottom electrode layer 210A and a second bottom electrode layer 210B separated by a first a first patterned line opening P1 in the bottom electrode layer 210. A subcell layer 220 is formed over the bottom electrode layer 210, the subcell layer 220 including a first subcell layer 220A and a second subcell layer 220B separated by a second patterned line opening P2 in the subcell layer 220. A patterned top electrode layer 250 is located over the subcell layer 220, the patterned top electrode layer 250 including a first top electrode layer 250A over the first subcell layer 220A and a second top electrode layer 250B over the second subcell layer 220B. In the embodiment illustrated, a solar cell 120 diode path extends between the second bottom electrode layer 210B, the first top electrode layer 250A, the first subcell layer 220A, and the first bottom electrode layer 210A, and a bypass diode 300 path extends between the second bottom electrode layer 210B and the first bottom electrode layer 210A.

In the particular embodiment illustrated, the subcell layer 220 may include a perovskite absorber layer. However, the general arrangement is not limited to perovskite materials. In an embodiment, the subcell layer 220 includes an absorber layer formed of a material such as CdTe, CIGS, or an organic semiconductor. In an embodiment, the subcell layer 220 includes a tandem structure including multiple subcells.

In an embodiment, the solar cell interconnect includes the bottom electrode layer 210, the first patterned line opening P1 in the bottom electrode layer 210, the subcell layer 220 over the bottom electrode layer 210, the second patterned line opening P2 in the subcell layer 220 as described above. An insulator layer 295 may optionally be formed along the sidewalls 222 of the subcell layer 220. Insulator layer 295 may be formed of a polymer or metal oxide, for example. As illustrated in FIG. 6A, a semiconductor-based bypass layer 230 may be formed along a sidewall 222 of the subcell layer 220 in the second patterned line opening P2. This may be along a sidewall of the absorber layer, or multiple layers in the subcell layer 220. The semiconductor-based bypass layer 230 may be formed directly on the sidewall 222, or on an optional intervening layer such as insulator layer 295. It is to be appreciated that while the second patterned line opening P2 is specified, that this does not exactly require this to be a second patterned line opening. Rather, reference to "second" patterned line opening is generalized, and additional, non-described, patterned line openings may be present. The same relationship, and generalization, also applies to the first and third patterned line openings P1, P3, respectively. Still referring to FIG. 6A, a conductive plug 270 is located adjacent the semiconductor-based bypass layer 230 and within the second patterned line opening P2. The top electrode layer 250 may then be formed over the subcell layer 220, and a third patterned line opening P3 is formed in the top electrode layer 250.

As shown in FIG. 6A, the second patterned line opening P2 can overlap the first patterned line opening P1. Specifically, P2 may be wider than P1. P1 may additionally be entirely located within P2 such that a top surface of the bottom electrode layer 210 is exposed. For example, the top surface of the first bottom electrode layer 210A may be exposed. This can aid with charge transport for the bypass diode 300. The top surface of the second bottom electrode layer 210B may also be exposed. This can facilitate electrical contact with the conductive plug 270. In the particular arrangement illustrated, the semiconductor-based bypass layer 230 is formed within the first patterned line opening P1 and on a top surface of the bottom electrode layer 210 on a single side of the first patterned line opening P1. The conductive plug 270 may also fill a volume of the first patterned line opening P1, and second patterned line opening P2, and may optionally be in direct contact with the opposite sidewall 222. In an embodiment, a coating 280 may optionally be applied on the semiconductor-based bypass layer 230. For example, the coating 280 may be a thin layer of a material to improve selectivity with the conductive plug 270, and improve the Schottky junction. In an embodiment, the coating 280 includes nanoparticles In an embodiment, a conformal barrier layer 240 is optionally formed over the subcell layer 220, the semiconductor-based bypass layer 230, and the conductive plug 270, and underneath the top electrode layer 250. In particular, a conformal barrier layer 240 may be present when the top electrode layer 250 includes a metal layer, the bottom electrode layer 210 includes a transparent material, and the absorber layer is sensitive to metal contamination.

The conformal barrier layer 240 may function to transport charge through its thickness, and not be laterally conductive so as to not short adjacent cells 120. In an embodiment, the conformal barrier layer 240 is characterized by a resistivity greater than 0.1 ohm·cm. It has been observed that perovskite materials are prone to decomposition at elevated temperatures, and in particular the A-site cation of $ABX_3$ metal-halide perovskites. Additionally, perovskite materials are highly susceptible to metal induced degradation caused by halide-metal interactions. In accordance with embodiments, a conformal barrier layer 240 may be used to protect against either of decomposition and metal induced degradation due to diffusion from a metal electrode. In accordance with embodiments, the conformal barrier layer 240 may encapsulate a subcell layer 220 that includes a perovskite material absorber layer. In an embodiment, the conformal barrier layer 240 laterally surrounds the outside perimeter 224 of the subcell layer 220, or at least the perovskite material absorber layer of the subcell layer 220.

In accordance with embodiments, the subcell layer 220 includes a bottom transport layer of first charge transport type, an absorber layer over the bottom transport layer, and a top transport layer of second charge transport type opposite the first charge transport type. For example, referring briefly to FIG. 2B, in an exemplary embodiment the first charge transport layer is a hole transport layer 330, and is p-type. In this embodiment, the top transport layer is then an electron transport layer, or n-type. The semiconductor-based bypass layer 230 in accordance with embodiments is the second charge transport type, or n-type, while the conductive plug is characterized by a deep work function, in the exemplary embodiment. In this configuration, the semiconductor-based bypass layer 230 and the conductive plug 270 form a Schottky diode (bypass diode 300) across the first patterned line opening P1 in the bottom electrode layer 210.

It is to be appreciated that the charge transport types described may be reversed. Where Schottky diodes are implemented, the semiconductor-based bypass layer 230 is formed of a semiconductor material, while the conductive plug 270 contains an electrically conductive material (e.g. carbon or metal). In an embodiment, a coating 280 is formed on the semiconductor-based bypass layer 230, between the semiconductor-based bypass layer 230 and the conductive plug 270. The coating 280 may be characterized by the same or opposite charge transport type as the semiconductor-based bypass layer 230, depending upon configuration. The material of the coating 280 may be chosen for selectivity with the material of the semiconductor-based bypass layer 230.

Thus, in an embodiment in which the semiconductor-based bypass layer 230 is n-type, the conductive plug 270 may have a deep work function (e.g. −4.5 to −6 eV, inclusive of carbon (~−5 eV) and metals such as gold (~−5.2 eV), and silver (−4.3 to −4.7 eV) as minimum work function). Conversely, where the semiconductor-based bypass layer 230 is p-type, the conductive plug may have a shallow work function (e.g. between −2 and −4.5 eV, inclusive of aluminum (~−4.1 eV)).

In addition to the above requirements, selection of the semiconductor-based bypass layer 230 and conductive plug 270 materials may also be affected by materials selection of the bottom electrode layer 210. According to embodiments in which the bottom electrode layer 210 is transparent, a transparent conductive oxide such as ITO can be ambipolar, and create an ohmic contact with a semiconductor-based bypass layer 230 regardless of charge transport type.

Figure 6B:
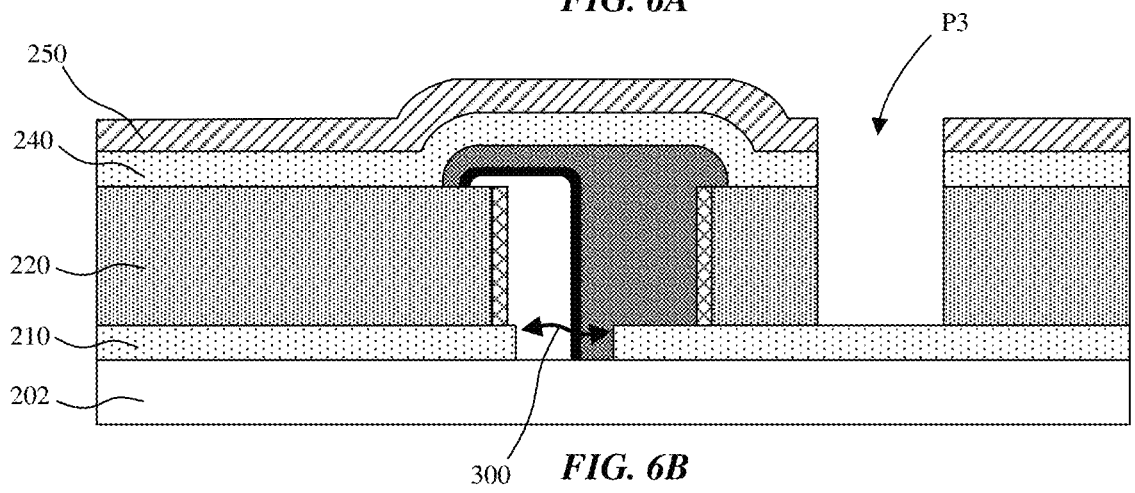
FIGS. 6B-6C are schematic cross-sectional side view illustrations of variations of the solar cell interconnect of FIG. 6A in accordance with an embodiment.

Another alternative is illustrated in FIG. 6B, where rather than patterning only the top electrode layer 250 to form the third patterned line opening P3, the patterning can be extended into underlying layers. In this case, the third patterned line opening P3 extends through the optional conformal barrier layer 240, and at least partially through the subcell layer 220. In the alternative embodiment illustrated in FIG. 6C, an insulating material 290 may be applied to fill and passivate the third patterned line opening P3.

Figure 6C:
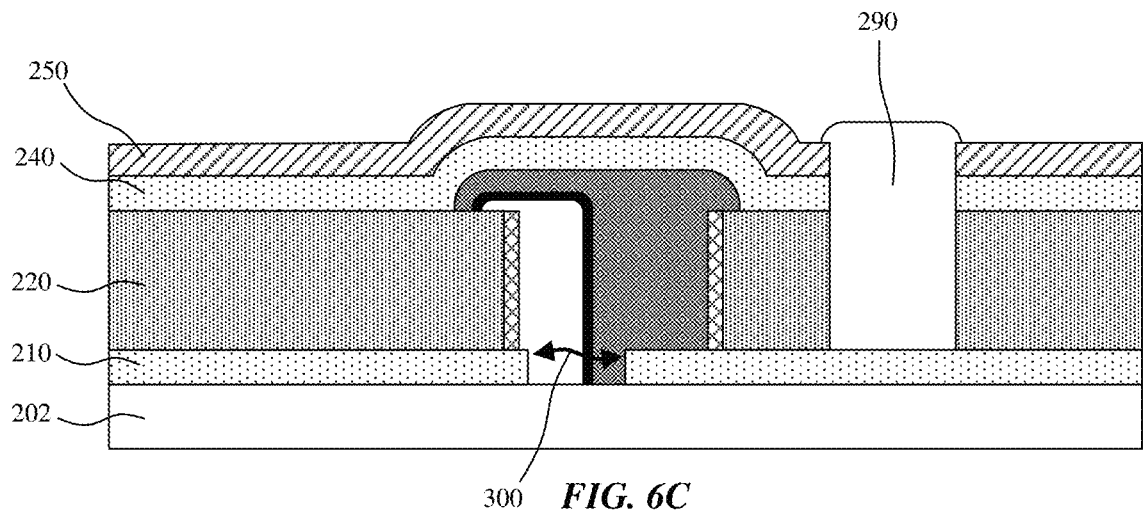
Figure 7:
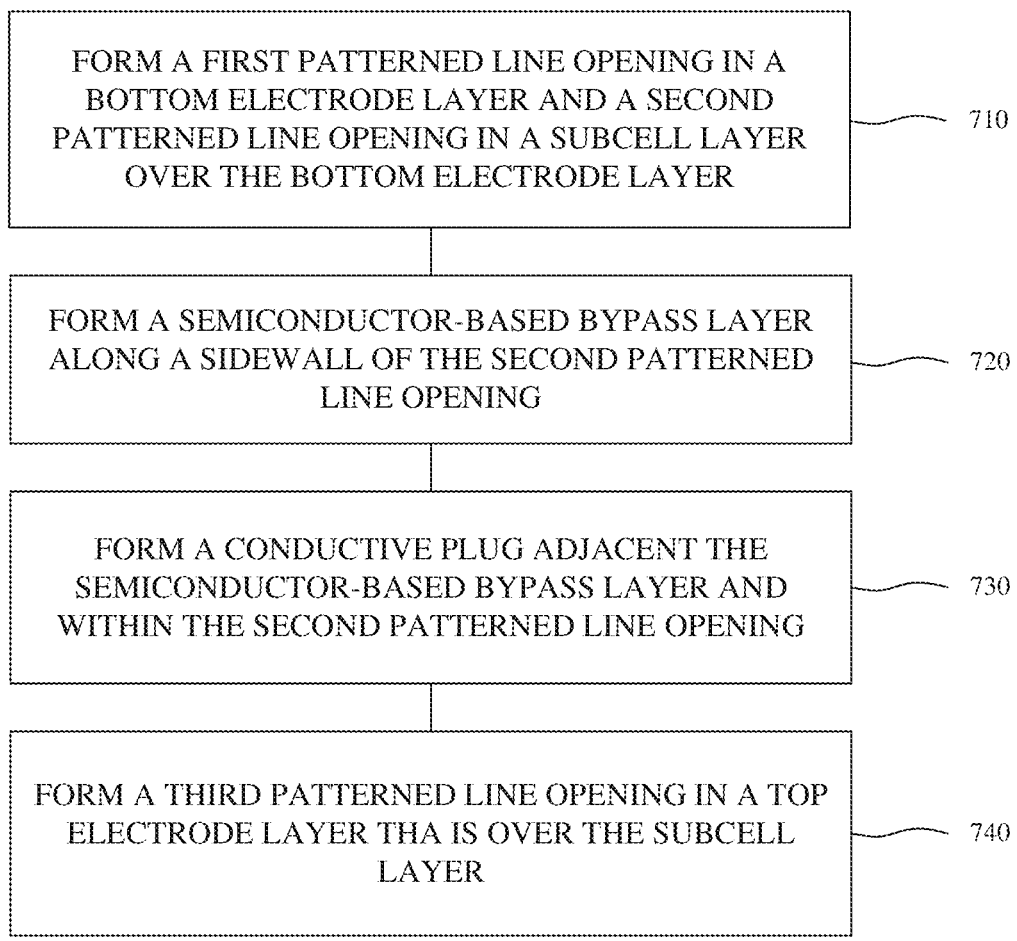
FIG. 7 is flow chart illustrating a method of forming the solar cell interconnect of FIG. 6 in accordance with an embodiment.
Figure 8A:
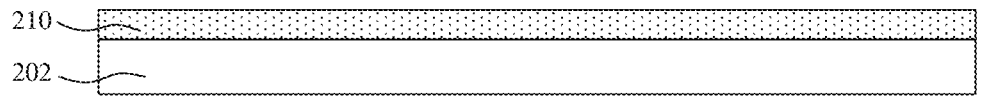
FIGS. 8A-8I are schematic cross-sectional side view illustrations of a method of forming the solar cell interconnect of FIG. 6A in accordance with an embodiment.
Figure 8B:
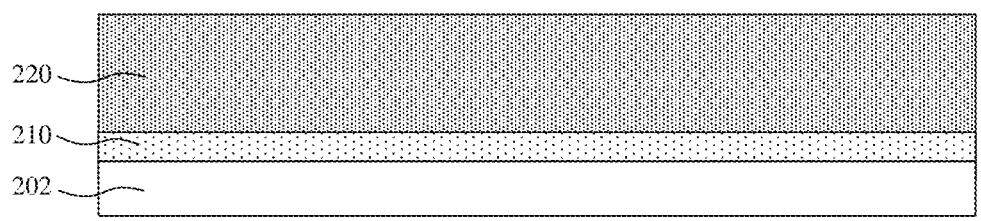
Figure 8C:
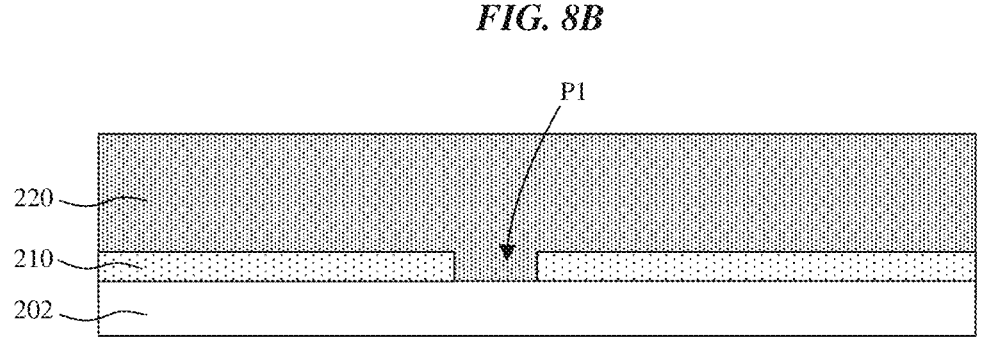
Figure 8D:
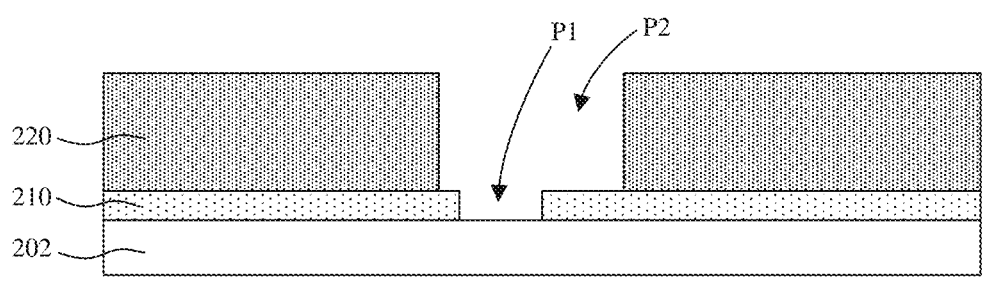
Figure 8E:
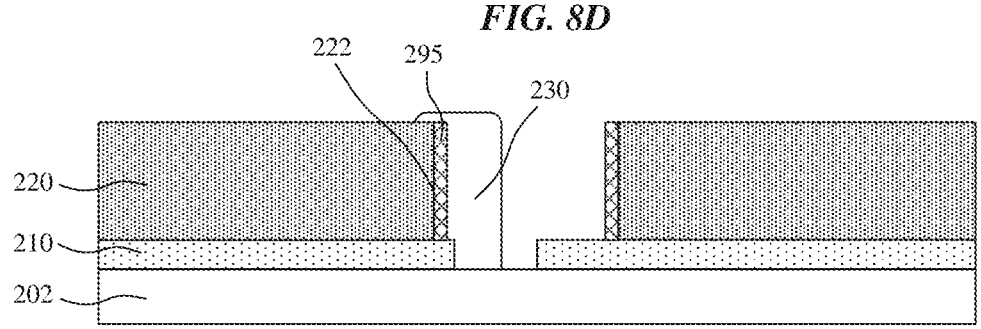
Figure 8F:
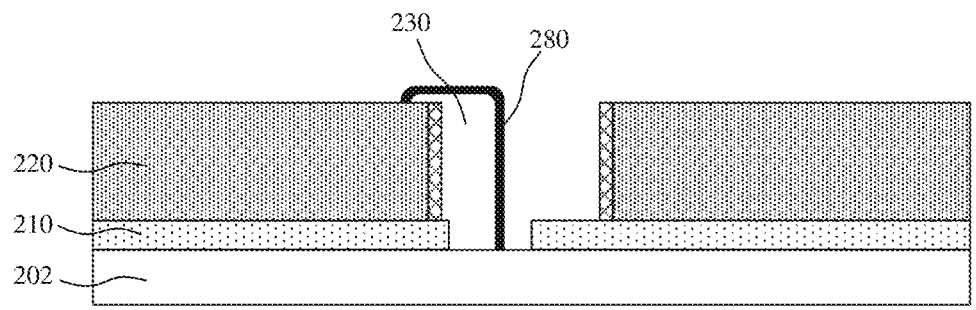
Figure 8G:
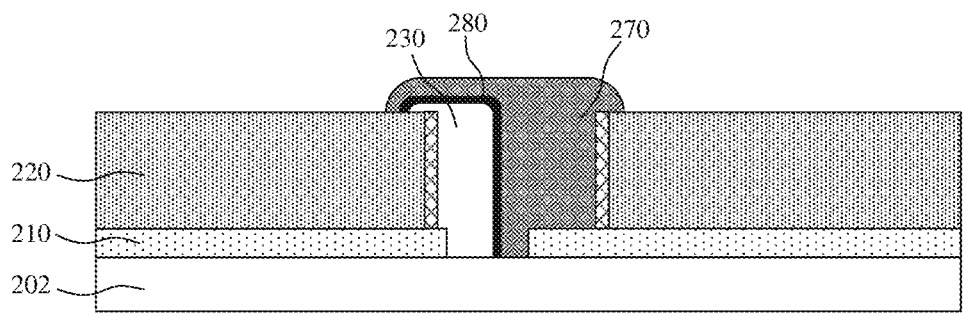
Figure 8H:
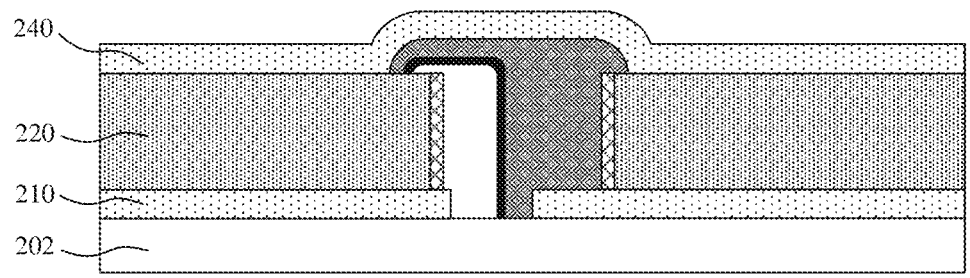
Figure 8I:
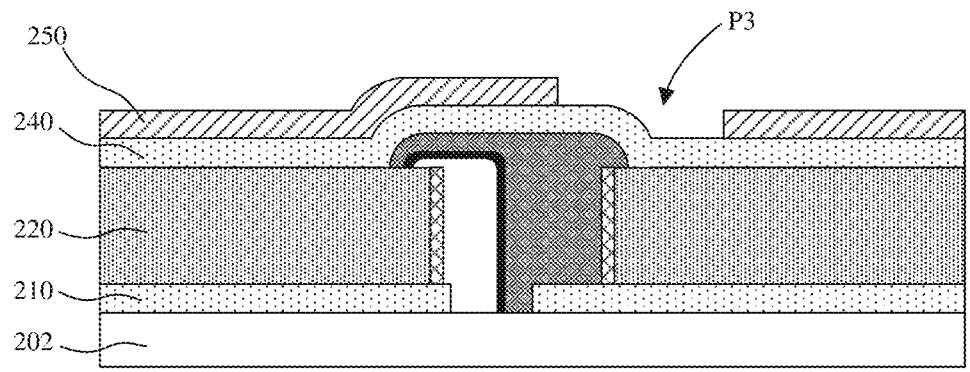

Referring now to FIGS. 7-8I, FIG. 7 is flow chart illustrating a method of forming the interconnect of FIG. 5A in accordance with an embodiment. FIGS. 8A-8I are schematic cross-sectional side view illustrations of a method of forming the interconnect of FIG. 6A in accordance with an embodiment. In the following description, the processing sequence of FIG. 7 is made with regard to the cross-sectional side view illustrations of FIGS. 8A-8I. In interests of conciseness, and to not overly obscure embodiments the processing sequence variations to for the embodiments illustrated in FIGS. 6B-6C are not separately illustrated, and instead are described together along with FIGS. 7-8I. Additionally, it is understood that certain embodiments may be practiced without one or more of these specific details, or in combination with other known methods and configurations described herein.

As shown in FIG. 8A the processing sequence may begin with a substrate 202. Substrate 202 may be a single or multiple layer substrate, including one or more layers of glass, plastic, or conductive metal foil. The bottom electrode layer 210 may then be formed on substrate 202. In the particular embodiment illustrated, bottom electrode layer 210 may be transparent and formed of materials such as TCOs, including ITO, FTO, IZO, and cadmium stannate, etc. In alternative embodiments where the top electrode layer will be transparent, the bottom electrode layer may be formed of a metallic material such as molybdenum.

The subcell layer 220 is then formed over the bottom electrode layer 210, as shown in FIG. 8B. The subcell layer 220 generally includes a subcell including an absorber layer and one or more transport layers. In an embodiment, the subcell layer includes an absorber layer between a hole transport layer and an electron transport layer. The subcell layer 220 may include a single subcell, or multiple subcells such as with a tandem structure. In accordance with embodiments, the subcell layer 220 includes one or more absorber layers including a perovskite material. In an embodiment, the subcell layer 220 includes a tandem structure including a perovskite material in one or both of the subcells. For example, a tandem perovskite cell structure may include two subcells with perovskite absorber layers with different bandgaps. Perovskite materials may be characterized by the formula $ABX_3$, with A representing a large atomic or molecular cation (e.g. Cs, methylammonium, formamidinium, dimethylammonium, guanidinium, etc.), with B representing a positively charged cation (e.g. metal, lead, plumbate, Sn), and X representing a negatively charged anion (e.g. halide, I, Br, Cl).

Referring now to FIG. 8C-8D, at operation 710 a first patterned line opening P1 is formed in the bottom electrode layer 210, and a second patterned line opening P2 is formed in the subcell layer 220. Formation of the first patterned line opening P1 may be formed at various stages. For example, P1 may be formed prior to deposition of the subcell layer 220. P1 may be formed after deposition of the first transport layer (e.g. hole transport layer), and prior to the absorber layer. P1 may be formed after the subcell layer 220. Various patterning techniques such as mechanical or laser scribing, chemical etching, or deposition with a shadow mask can be used to form P1 depending upon the timing. In an embodiment, mechanical or laser scribing is utilized in a roll-to-roll manufacturing process. The second patterned line opening P2 may overlap P1. Various patterning techniques such as mechanical or laser scribing, chemical etching, or deposition with a shadow mask can be used to form P2. In an embodiment, mechanical or laser scribing is utilized due to chemical stability of the perovskite absorber layer(s).

Referring now to FIGS. 8E, at operation 720 a semiconductor-based bypass layer 230 is formed along a sidewall 222 of the subcell layer within P2. An insulator layer 295 may optionally be formed along the sidewalls 222 of the subcell layer 220 prior to the semiconductor-based bypass layer 230. Insulator layer 295 may be formed of a polymer or metal oxide, for example. In the specific embodiment illustrated, the semiconductor-based bypass layer 230 and optional insulator layer 295 are applied using a printing technique such as ink jet, extrusion, spraying, screen printing, etc. In an embodiment, the semiconductor-based bypass layer 230 is formed of a material that does not react with the absorber layer(s). In an embodiment, the semiconductor-based bypass layer is formed of a semiconductor material to facilitate the formation of a Schottky junction. In an embodiment, the semiconductor-based bypass layer 230 is formed of an intrinsic n-type semiconductor such as titanium oxide ($TiO_2$) which can be made intrinsically n-type. For example, this may be caused by creating oxygen vacancies and titanium interstitials. Titanium oxide can also be doped to render the material n-type, such as doping with niobium, tungsten, and manganese.

A coating 280 may then optionally be applied to the semiconductor-based bypass layer 230 as illustrated in FIG. 8F, followed by the deposition of a conductive plug at operation 730 and illustrated in FIG. 8G. For example, the coating 280 applied to improve selectivity of the junction and improve reverse current leakage of the bypass diode. In an embodiment the coating 280 is a thin coating including nanoparticles. Both the coating 280 and conductive plug 270 may be applied using a suitable printing technique such as ink jet, extrusion, spraying, screen printing, etc. In an embodiment the optional coating 280 is characterized by the opposite charge transport type as the semiconductor-based bypass layer 230. For example, if the semiconductor-based bypass layer 230 is p-type, the optional coating 280 is n-type, and vice versa.

In an embodiment in which the semiconductor-based bypass layer 230 is n-type, the conductive plug 270 may have a deep work function (e.g. −4.5 to −6 eV, inclusive of carbon and metals such as gold, and silver as minimum work function). Conversely, where the semiconductor-based bypass layer 230 is p-type, the conductive plug may have a shallow work function (e.g. between −2 and −4.5 eV, including aluminum). In an embodiment, conductive plug 270 is formed of carbon particles (e.g. carbon black), or a carbon/polymer blend.

Referring now to FIG. 8H a conformal barrier layer 240 is optionally formed over the subcell layer 220, semiconductor-based bypass layer 230, optional coating 280, and conductive plug 270. The conformal barrier layer 240 may be continuous. The conformal barrier layer 240 may function to encapsulate and protect the subcell layer 220, for example from decomposition and metal diffusion. Exemplary materials include oxides (e.g. metal oxides), nitrides (e.g. metal nitrides), polymers, and small molecules. Exemplary metal oxides may be titanium oxide, zinc oxide, tin oxide, nickel oxide, vanadium oxide, tungsten oxide, indium oxide, any of which may be doped. For example, some TCOs may be ITO, AZO, IZO cadmium stannate. Exemplary metal nitrides include at least titanium nitride and tungsten nitride. Some exemplary polymers include poly (triaryl amine) (PTAA) and polyaniline. Some exemplary small molecules include 2,2',7,7'-Tetrakis[N,N-di(4-methoxyphenyl)amino]-9,9'-spirobifluorene (spiro-MeO-TAD), and fullerenes. Suitable deposition techniques to form a conformal layer may include chemical vapor deposition (CVD), atomic layer deposition (ALD), solution coating and evaporation. In an embodiment, the conformal barrier layer is less than 1,000 nm thick, such as less than 150 nm thick, or more specifically less than 50 nm thick such as 10-40 nm thick. The conformal barrier layer may be doped. For example, the conformal barrier layer may be AZO. The conformal barrier layer may be sufficiently thin to transport charge through its thickness, and not be laterally conductive. The conformal barrier layer 240 may be characterized by a resistivity greater than 0.1 ohm·cm. In an embodiment, the conformal barrier layer also functions as an electron transport layer for the solar cell 120. Alternatively, the conformal barrier layer may function as a hole transport layer for the solar cell 120.

In an embodiment, an AZO containing conformal barrier layer 240 is formed using ALD or low temperature CVD to form an amorphous layer. The aluminum doping concentration need not create a high conductivity, and instead may be sufficient to only pass charge through its thickness, as opposed to laterally. In this aspect, the conformal barrier layer in accordance with embodiments can function more as a barrier as opposed to conductor. For example, aluminum dopant concentration within an AZO conformal barrier layer 240 may be less than the aluminum dopant concentration within an AZO bottom electrode layer 210. Morphology can also be different compared to an AZO electrode layer. The low temperature deposition process may not provide necessary conditions for crystal growth. This may be in contrast to a high temperature process (e.g. high temperature sputter and anneal) used for the formation of a crystalline AZO layer for use as an electrode layer wherein the crystallinity provides long range mobility and less defects. The conformal barrier layer 240 in accordance with embodiments may function to pass charge between the electrodes, yet have a sufficient resistivity to not short across a patterned electrode layer. Furthermore, the conformal barrier layer 240 may encapsulate the subcell layer (e.g. metal-halide perovskite) to prevent perovskite-metal contact and perovskite decomposition.

The top electrode layer 250 may then be formed over the optional conformal barrier layer and on the conformal barrier layer, and patterned to include a third patterned line opening P2 at operation 740 as illustrated in FIG. 8I. In a particular embodiment, the top electrode layer 250 is deposited through a shadow mask to form the third patterned line opening P3 during deposition. This may protect underlying layers from solution processing operation. Suitable deposition technique may include evaporation, sputter, printing, and spraying. In an embodiment, the top electrode layer 250 includes one or more metal layers, such as Ag, Cu, Al, Au, etc.

In an embodiment scribing is utilized to form P3 in the top electrode layer 250. In the embodiments illustrated in FIGS. 6B-6C, the scribing can be used to form P3 partially or completely through any of the top electrode layer 250, conformal barrier layer 240, and subcell layer 220. In such an embodiment, P3 is partially or fully filled with an insulating material 260 to provide protection for the absorber layer(s).

In the foregoing description, specific processing techniques and materials selections have been provided. It is to be appreciated that that the specific processing techniques and materials selections may also be applied to the following variations where appropriate. Accordingly, in interest of conciseness, the following description is focused on structural or materials characteristics specific to the illustrated embodiments, and a discussion of generalized structures or processing techniques and materials is not repeated.

Figure 9:
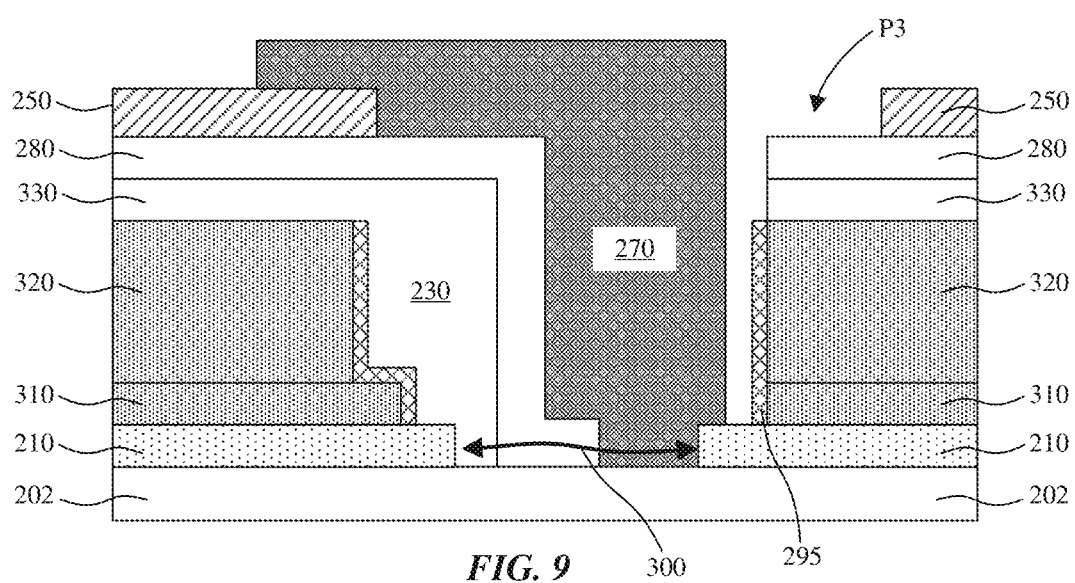
FIG. 9 is a schematic cross-sectional side view illustration of a solar cell interconnect in accordance with an embodiment.

FIG. 9 is a schematic cross-sectional side view illustration of a solar cell interconnect variation in accordance with an embodiment. Similar to above embodiments, the solar cell interconnection structure illustrated in FIG. 9 may be compatible with perovskite-based absorber materials. In the specific embodiment illustrated in FIG. 9, the bottom transport layer within the subcell layer may be n-type, and the bypass diode 300 may be a Schottky diode.

In the particular embodiment illustrated, a bottom electrode layer 210 is formed on substrate 202 and patterned to form a first patterned line opening P1. The bottom electrode layer 210 may be formed of a transparent material(s). A subcell layer is formed over the bottom electrode layer 210. As shown, the bottom ETL 310 and absorber layer 320 form the subcell layer into which P2 is formed. A top HTL 330 may be formed over the absorber layer 320 and along one of the sidewalls within P2. In the embodiment illustrated, the top HTL 330 may additionally function as the semiconductor-based bypass layer 230 as described above. A coating 280 may then optionally be applied to the semiconductor-based bypass layer 230 to improve selectivity with the conductive plug 270. In an embodiment, the coating 280 is formed of the same charge transport type as the semiconductor-based bypass layer 230.

In an embodiment, the bottom electrode layer 210 in the solar cell interconnect illustrated in FIG. 9 is formed of a transparent material (e.g. ITO), the bottom ETL 310 is formed of n-type $TiO_2$, the absorber layer 320 includes a perovskite, and the semiconductor-based bypass layer 230 is formed of p-type spiro-MeOTAD (an organic semiconductor). The optional coating 280 may be formed of one or more layers of vanadium oxide and/or nickel oxide. In an embodiment, the optional coating 280 is p-type vanadium oxide and/or nickel oxide. The conductive plug 270 may be formed of a shallow work function material such as aluminum.

Figure 10:
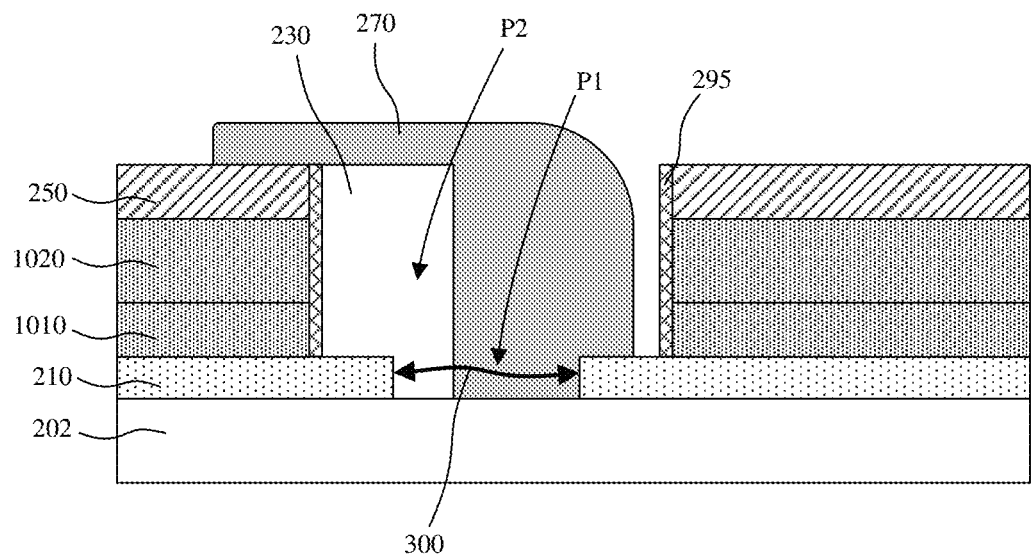
FIG. 10 is schematic cross-sectional side view illustration a solar cell interconnect in accordance with an embodiment.

FIG. 10 is a schematic cross-sectional side view illustration of an alternative solar cell interconnect in accordance with an embodiment. For example, the solar cell interconnect of FIG. 10 may be compatible with a cadmium-telluride absorber layer. Similar to above embodiments, the substrate 202 may be formed of a transparent material such as glass, and the bottom electrode layer 210 may formed of a transparent material such as FTO. The subcell layer may include a bottom electron transport layer 1010 (n-type) and a p-type CdTe absorber layer 1020. A reflective top electrode layer 250 (e.g. nickel) may be formed over the subcell layer. In an exemplary embodiment, the semiconductor-based bypass layer 230 may be formed of p-type NiO, and the conductive plug 270 is formed of a shallow work function material such as aluminum. Alternatively, a titanium or silver paste may be used to protect the CdTe from degradation caused by aluminum. In the particular embodiment illustrated in FIG. 10, only two patterned line openings P1, P2 need be formed.

Figure 11A:
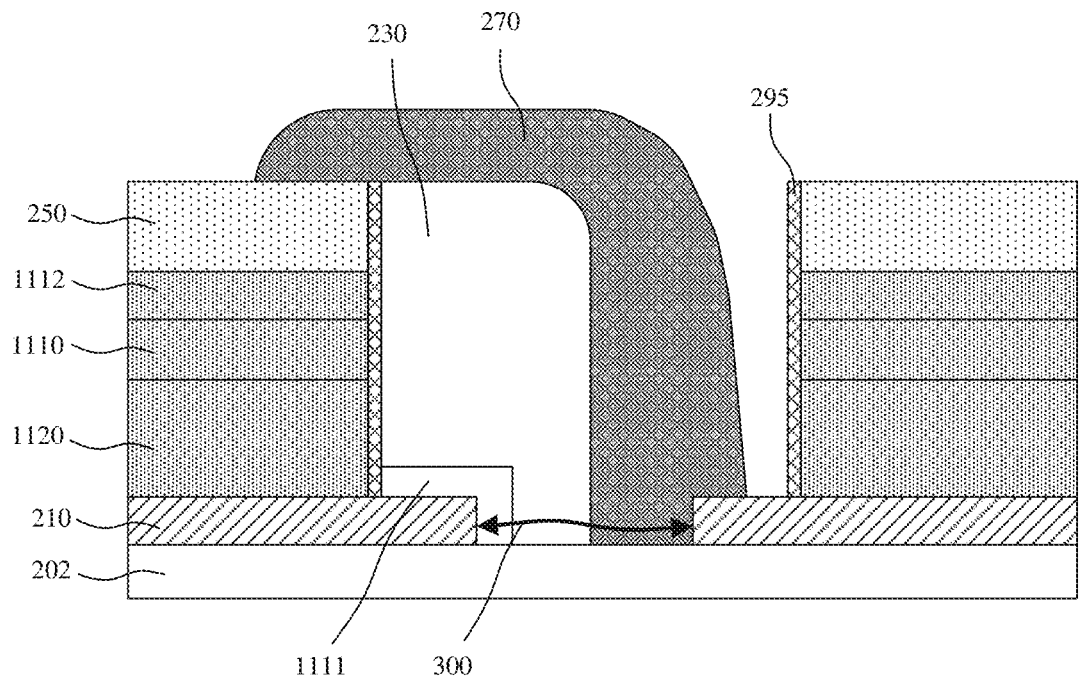
FIGS. 11A-11B are schematic cross-sectional side view illustration a solar cell interconnects in accordance with an embodiment.
Figure 11B:
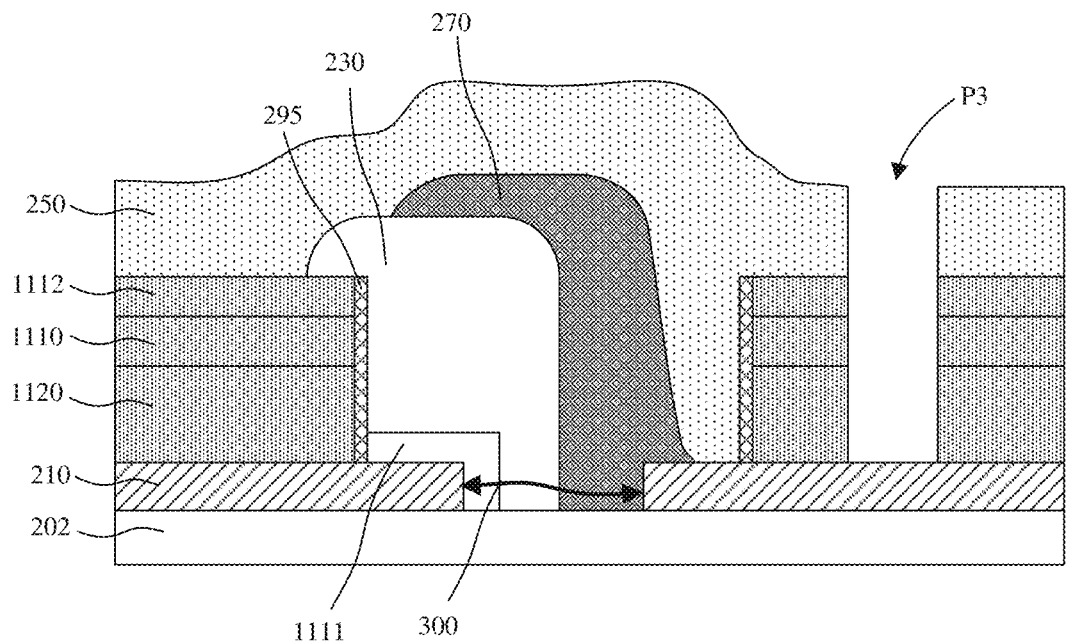

FIGS. 11A-11B are schematic cross-sectional side view illustration a solar cell interconnects in accordance with embodiments. For example, the solar cell interconnects of FIGS. 11A-11B may be compatible with a CIGS absorber layer. In a departure from the already described embodiments, the bottom electrode layer 210 for a CIGS solar cell may be formed of a reflective material, such as molybdenum. As illustrated, the subcell may include a p-type CIGS absorber layer 1120, a n-type CdS buffer layer 1110, and n-type ZnO semi-insulating layer 1112. The top electrode layer 250 may be transparent, and formed of a material such as AZO.

Unlike transparent conductive oxides, molybdenum may not make ohmic contact with both n-type and p-type semiconductors. In the embodiments illustrated, a metal oxide contact layer 1111, specifically molybdenum oxide, is formed over the exposed edge of the bottom electrode layer 210 that resulted from the P2 scribe. This may be accomplished by oxidation of the exposed portion of the molybdenum bottom electrode 210 after the P2 scribe, and optional insulator layer 295 formation. The molybdenum oxide may have a majority of electron carriers, rendering the material n-type, though a large ionization energy also renders the material suitable as a hole transporting material. Alternatively, the metal oxide contact layer 1111 may be formed by printing metal oxide (e.g. ITO) particles on top of the exposed bottom electrode 210.

In the exemplary embodiments, the semiconductor-based bypass layer 230 is formed of an n-doped metal oxide material such as zinc oxide, aluminum doped zinc oxide (AZO), tin oxide, indium oxide, titanium oxide, and niobium doped titanium oxide. The conductive plug 270 may be formed of a deep work function material such as molybdenum, carbon, nickel or silver. The metal oxide contact layer 1111 may function to improve electrical contact between the molybdenum bottom electrode 210 and the semiconductor-based bypass layer 230.

In the particular embodiment illustrated in FIG. 11A, only two patterned line openings P1, P2 need be formed. The embodiment illustrated in FIG. 11B includes a third patterned line opening P3 through the top electrode layer 250 and one or more layers of the subcell layer.

In utilizing the various aspects of the embodiments, it would become apparent to one skilled in the art that combinations or variations of the above embodiments are possible for forming a solar cell module and solar cell interconnects with integrated bypass diodes. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A solar cell module comprising:
    a string of solar cells connected in series;
    wherein a pair of adjacent solar cells in the string of solar cells and interconnect therebetween is characterized by:
        a first solar cell including a first bottom electrode layer, a first subcell layer over the first bottom electrode layer, and a first top electrode layer over the first subcell layer;
        a second solar cell including a second bottom electrode layer, a second subcell layer over the second bottom electrode layer, and a second top electrode layer over the second subcell layer;
        a solar diode that extends between the second bottom electrode layer, the first top electrode layer, the first subcell layer, and the first bottom electrode layer;
        a bypass diode between the second bottom electrode layer and the first bottom electrode layer;
        a first patterned line opening between the first bottom electrode layer and the second bottom electrode layer;
        a second patterned line opening between the first subcell layer and the second subcell layer, the second patterned line opening characterized by a width between the first subcell layer and the second subcell layer, and a height;
        a semiconductor-based bypass layer along a sidewall of the first subcell layer within the width of the second patterned line opening and a sidewall of the first bottom electrode layer within the first patterned line opening;
        a conductive plug laterally adjacent the semiconductor-based bypass layer within the width of the second patterned line opening to substantially fill the height of the second patterned line opening; and
        wherein the first top electrode layer and the second top electrode layer each comprise a metal layer and the conductive plug comprises a blend of a polymer and an electrically conductive material, the first top electrode layer spans over a portion of the conductive plug and a portion of the first subcell layer that is not covered by the conductive plug, and the second top electrode layer spans over a portion of the second subcell layer that is not covered by the conductive plug.

2. The solar cell module of claim 1, wherein the conductive plug is adjacent the semiconductor-based bypass layer and within the first patterned line opening.

3. The solar cell module of claim 2:
    wherein each of the first and second subcell layers includes a bottom transport layer of first charge transport type, an absorber layer over the bottom transport layer, and a top transport layer of second charge transport type opposite the first charge transport type; and
    wherein the semiconductor-based bypass layer is characterized by the second charge transport type.

4. The solar cell module of claim 3, wherein the bypass diode is comprised of the semiconductor-based bypass layer and the conductive plug.

5. The solar cell module of claim 3, wherein the conductive plug is characterized by a deep work function where the second charge transport type is n-type, or the conductive plug is characterized by a shallow work function where the second charge transport type is p-type.

6. A solar cell interconnect comprising:
    a bottom electrode layer;
    a first patterned line opening in the bottom electrode layer;
    a subcell layer over the bottom electrode layer;
    a second patterned line opening in the subcell layer, the second patterned line opening characterized by a width and a height;
    a semiconductor-based bypass layer along a sidewall of the subcell layer in the second patterned line opening;
    a conductive plug laterally adjacent the semiconductor-based bypass layer within the width of the second patterned line opening to substantially fill the height of the second patterned line opening;
    a top electrode layer over the subcell layer; and
    a third patterned line opening in the top electrode layer;
    wherein the top electrode layer comprises a metal layer and the conductive plug comprises a blend of a polymer and an electrically conductive material, and the top electrode layer spans over a portion of the conductive plug and a portion of the subcell layer that is not covered by the conductive plug.

7. The solar cell interconnect of claim 6, wherein the electrically conductive material is carbon.

8. The solar cell interconnect of claim 7, wherein the second patterned line opening overlaps the first patterned line opening, and wherein the semiconductor-based bypass layer is formed within the first patterned line opening and on a top surface of the bottom electrode layer on a single side of the first patterned line opening.

9. The solar cell interconnect of claim 6, further comprising a conformal barrier layer over the subcell layer, the semiconductor-based bypass layer, and the conductive plug, and underneath the top electrode layer, wherein the conformal barrier layer is characterized by a resistivity greater than 0.1 ohm·cm.

10. The solar cell interconnect of claim 6, wherein the bottom electrode layer comprises a transparent material.

11. The solar cell interconnect of claim 6:
    wherein the subcell layer includes a bottom transport layer of first charge transport type, an absorber layer over the bottom transport layer, and a top transport layer of second charge transport type opposite the first charge transport type; and
    wherein the semiconductor-based bypass layer is characterized by the second charge transport type.

12. The solar cell interconnect of claim 11, wherein the semiconductor-based bypass layer and the conductive plug form a Schottky diode across the first patterned line opening in the bottom electrode layer.

13. The solar cell interconnect of claim 11, further comprising a coating on the semiconductor-based bypass layer and between the conductive plug and the semiconductor-based bypass layer, wherein the coating is characterized by the first charge transport type.

14. The solar cell interconnect of claim 11, wherein the electrically conductive material is carbon.

15. The solar cell interconnect of claim 14, wherein the subcell layer includes a perovskite absorber layer, and further comprising a conformal barrier layer over the subcell layer and the conductive plug, and underneath the patterned top electrode layer.

* * * * *